United States Patent
Kimura et al.

(10) Patent No.: US 7,333,525 B2
(45) Date of Patent: Feb. 19, 2008

(54) INTEGRATED SEMICONDUCTOR LIGHT-EMITTING DEVICE AND METHOD FOR MANUFACTURING SAME

(75) Inventors: Yoshinori Kimura, Saitama-ken (JP);
Mamoru Miyachi, Saitama-ken (JP);
Kiyofumi Chikuma, Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 205 days.

(21) Appl. No.: 11/038,576

(22) Filed: Jan. 21, 2005

(65) Prior Publication Data

US 2005/0175053 A1 Aug. 11, 2005

(30) Foreign Application Priority Data

Jan. 23, 2004 (JP) ............................ 2004-016023

(51) Int. Cl.
*H01S 5/00* (2006.01)
(52) U.S. Cl. .................................. 372/50.1; 372/50.12
(58) Field of Classification Search ............. 372/43.01
See application file for complete search history.

(56) References Cited

U.S. PATENT DOCUMENTS 5,086,431 A 2/1992 Hardy, Jr. et al.
6,282,220 B1 * 8/2001 Floyd ...................... 372/50.1
2002/0097662 A1 7/2002 Fujii

FOREIGN PATENT DOCUMENTS

| EP | 1 434 321 A1 | 6/2004 |
| JP | 09232677 | * 9/1997 |
| JP | 2002-252593 B1 | 9/2000 |
| JP | 2002-118331 | 4/2002 |
| JP | 2002-176229 A | 6/2002 |

* cited by examiner

Primary Examiner—Dung T. Nguyen
(74) Attorney, Agent, or Firm—Arent Fox LLP

(57) ABSTRACT

An integrated semiconductor light-emitting device suitable for being mounted on a pickup is provided. The integrated semiconductor light-emitting device has a first laser part stacked on a semiconductor substrate and a projection-shaped second laser part formed by stack in thin-film-layer form. The second laser part is fitted into a trench formed adjacent to the first laser part in the semiconductor substrate. At least the first and second laser parts and the trench are bonded together through a metal bonding layer. An emission spot of the first laser part and an emission spot of the second laser part are located away in approximately the same horizontal direction perpendicular to the direction of the stack of the first and second laser parts.

7 Claims, 10 Drawing Sheets

CONVENTIONAL INTEGRATED
SEMICONDUCTOR LIGHT-EMITTING
DEVICE

INTEGRATED SEMICONDUCTOR LIGHT-EMITTING DEVICE AND METHOD FOR MANUFACTURING SAME

BACKGROUND OF THE INVENTION

1. Field of the Invention

This invention relates to an integrated semiconductor light-emitting device which emits a plurality of laser lights of different wavelengths, and a method for manufacturing the integrated semiconductor light-emitting device.

The present application claims priority from Japanese Application No. 2004-16023, the disclosure of which is incorporated herein by reference.

2. Description of the Related Art

These days, mass digital contents have become easily available because of proliferation of a digital broadcast and broadband, and so there is a need for higher density information processing technology.

For example, in the case of an optical disc used for recording/reproducing in an information recording/reproducing system such as a CD player and a DVD player, an increase in density from a CD (Compact Disc) with a capacity of 700 MB using a laser light with a wavelength of 780 nm band to a DVD (Digital Versatile Disc) with a capacity of 4.7 GB using a laser light with a wavelength of 650 nm band has been progressively attained. A further higher density optical disc with a capacity of 20 GB or more using a laser light with a wavelength of 405 nm band has been realized in recent years.

However, the information recording/reproducing system capable of recording on and reproducing from a high density optical disc needs a pickup equipped with an integrated semiconductor light-emitting device which is capable of emitting laser lights with wavelengths of 650 nm band and 780 nm band in addition to a laser light with a wavelength of 405 nm band, to provide compatibility enabling a user to continuously use the various optical discs which have been accumulated up to this time.

For reduction in size, weight and the like, it is desirable for a pickup having compatibility with a DVD to be equipped with the integrated semiconductor light-emitting devices for emitting two laser lights with wavelengths of 405 nm band and 650 nm band. However, it is impossible to realize such integrated semiconductor light-emitting devices on the same substrate by the use of monolithic semiconductor manufacturing technology. For this reason, an integrated semiconductor light-emitting device of a hybrid structure (2-wavelength laser device) is suggested by Japanese unexamined patent publication 2002-118331, for example.

As disclosed in FIG. 1 of the publication 2002-118331, the integrated semiconductor light-emitting device includes a 405 nm band InGaAlN-based semiconductor laser (i.e. first semiconductor light-emitting device) LD1 and a 650 nm band InGaAlP-based semiconductor laser (i.e. second semiconductor light-emitting device) LD2. The first and second semiconductor light-emitting devices LD1 and LD2 are combined by the use of a direct bonding (wafer fusion) technique to bond together a p-type GaN contact layer 101 and a p-type GaAs contact layer 121 which are respectively formed on the first and second semiconductor light-emitting devices LD1 and LD2.

When a drive current is fed through a common p-electrode 131 joined to the contact layers 101 and 121, the drive current flows through the contact layers 101, 121 and cap layers 102 and 122 and so on to active layers 107 and 126 for generation of laser light.

For manufacturing the conventional integrated semiconductor light-emitting device, the first things to be prepared are a first laser wafer for producing a plurality of first semiconductor light-emitting devices LD1 and a second laser wafer for producing a plurality of second semiconductor light-emitting devices LD2. The first and second laser wafers are then bonded by the direct bonding technique, and then cleaved into chips. For the use of the direct bonding technique to manufacture integrated semiconductor light-emitting devices having uniform qualities in terms of optical properties and the like, it is required that the surfaces on the side to be bonded in the first and second laser wafers have high degree of flatness.

This limitation makes it impossible to obtain an integrated semiconductor light-emitting device because of the difficulty of using the conventional direct bonding technique to bond a laser wafer for producing the semiconductor light-emitting devices having an uneven bonding surface to another laser wafer in a construction thereof.

For example, the first semiconductor light-emitting device LD1 used in the conventional integrated semiconductor light-emitting device is formed of the so-called buried-type GaN laser device having n-type InGaAlN current confinement layers 103 provided on both sides of a stripe-shaped p-type AlGaN cladding layer 104 and a stripe-shaped p-type GaN cap layer 102. However, a typical GaN laser device emitting a short-wavelength laser light (e.g. wavelength of 405 nm band) rarely has the buried structure, and often has ridge stripe structure capable of providing performance superior to that in the buried structure.

If the GaN ridge-stripe laser device is used instead of the first semiconductor light-emitting device LD1 with the buried structure, the surface of the semiconductor is covered with an $SiO_2$ insulating film and a ridge portion projects, for example. Hence, the bonding surface results in surface asperity, which in turn makes it impossible to use the conventional direct bonding techniques to bond the first and second semiconductor light-emitting devices LD1 and LD2 together.

In consequence, an integrated semiconductor light-emitting device using the GaN ridge-stripe laser is not able to be realized by the use of the conventional direct bonding techniques.

In the conventional integrated semiconductor light-emitting devices, a p-electrode is common to both of the first and second semiconductor light-emitting devices LD1 and LD2, so that electric current flows through the p-type GaN contact layer 101 and the p-type GaAs contact layer 121 to the respective stripe-shaped cap layers 102 and 122 from the in-plane direction (lateral direction).

However, both the p-type GaN contact layer 101 and the p-type GaAs contact layer 121 which are the semiconductor layers, have a far less than sufficient degree of electric conductivity, and therefore are of high resistance for serving as the path for an electric current inflow in the lateral direction. Thus, an increase in drive voltage and an increase in electrical power consumption are caused, leading to various problems such as the need to provide a large-sized heat dissipating structure.

Further, in the conventional integrated semiconductor light-emitting devices, emission spots of the first and second semiconductor light-emitting devices LD1 and LD2 are arranged in the vertical direction with respect to the active layers 107 and 126 (i.e. the thickness direction of the acitve layers 107 and 126). If the integrated semiconductor light-emitting device having such positional relation between these two emission spots is mounted on the pickup, the following problen arises.

As schematically illustrated in FIG. 10A, the pickup uses an objective lens OBJ to concentrate two different wavelength laser lights S1 and S2 on a signal recording layer of an optical disc DSC. The portion indicated with the reference symbol LD1 in FIG. 10A corresponds to the laser part for high density optical discs, which emits a blue laser light with a wavelength of 405 nm band. The portion indicated with the reference symbol LD2 corresponds to the laser part for DVDs which emits a red laser light with a wavelength of 650 nm band.

In this case, if the optical disc DSC is a DVD, the laser part LD2 is driven to emit the 650 nm laser light S2. The laser light S2 emitted from the laser part LD2 is focused on the signal recording layer of the optical disc DSC as a focused spot SP2 by the objective lens OBJ.

If the optical disc DSC is a high density optical disc, the laser part LD1 is driven to emit the 405 nm laser light S1. The laser light S1 emitted from the laser part LD1 is focused on the signal recording layer of the optical disc DSC as a focused spot SP1 by the objective lens OBJ.

Therefore, the focused spots SP1, SP2 on the signal recording layer of the optical disc DSC are affected by a shape of near field patterns (NFP) N1, N2 respectively emitted from the laser parts LD1, LD2.

Typically, the near field pattern of a semiconductor laser has an oval shape with a short diameter in a vertical direction y (the thickness direction of the active layer 107) with respect to the active layers 107, 126 and a long diameter in a horizontal direction x (the width direction) with respect to the active layers 107, 126 as indicated by the reference symbols N1 and N2 in FIG. 10A.

When the laser lights emitted from the oval-shaped near field patterns N1 and N2 are focused onto the optical disc DSC by the objective lens OBJ, because of the effect of the shape of the near field patterns N1 and N2, the focused spots SP1 and SP2 on the optical disc will be an oval shape with a short diameter in the vertical direction y and a long diameter in the horizontal direction x.

In the case that the optical disc DSC is a DVD, the integrated semiconductor light-emitting device is aligned so as to align the short diameter of the oval-shaped focused spot SP2 on the signal recording layer of the optical disc DSC with a tangential direction t to a track of the optical disc DSC as shown in FIG. 10B.

As compared with the case in which the integrated semiconductor light-emitting device is aligned so as to align the long diameter of the focused spot SP2 with the tangential direction to a track of the optical disc DSC, the alignment previously described substantially decreases the diameter of focused spot in the track direction of the optical disc DSC. Therefore, the signal resolution in the track direction is increased, so that high density recording becomes possible.

For this reason, the conventional integrated semiconductor light-emitting device needs to be mounted in the pickup so as to align the vertical direction y thereof with the tangential direction t with respect to the optical disc DSC as illustrated in FIG. 10B.

In this connection, suppose the optical disc DSC is a high-density disc and the optical system of the pickup is designed in such a way as to align the emission spot of the laser part LD1 which emits a 405 nm blue laser light with the optical axis center Q of the objective lens, the emission spot of the laser part LD2 which emits a 650 nm red laser light will be positioned out of the optical axis center Q of the objective lens.

When the optical disc DSC is changed to a DVD and the laser part LD2 emits a laser light, the laser light S2 does not have an incidence onto the signal recording layer of the optical disc DSC at a right angle to the signal recording layer. In other words, the laser light S2 enters the signal recording layer of the optical disc DSC at an inclined angle with respect to the tangential direction t to the track. The comatic aberration thus caused with respect to the tangential direction t results in a deterioration of the quality of the optical spot.

A typical pickup is equipped with a tilt correction mechanism for correction of an angle deviation between the disc surface and the optical axis of the objective lens which is caused by optical disc warp or the like. The tilt correction mechanism adjusts the angle of the pickup itself in order to keep an incident angle of the laser light on the signal recording layer of the optical disc at a right angle thereto at all times.

However, the tilt correction mechanism is capable of making an angle adjustment only to the tilt in the radial direction r of the optical disc DCS, and has no angle adjustment mechanism for a tilt in the tangential direction t. For this reason, it is impossible to make a tilt correction to the light coming in at an angle with respect to the tangential direction t which is caused when the integrated semiconductor light-emitting device is located as described above.

In consequence, if the conventional integrated semiconductor light-emitting device is mounted on a regular pickup, a correction to the incident angle of the laser light S2 entering at an inclined angle with respect to the tangential direction t is impossible. This results in further problem that the comatic aberration can not be reduced.

SUMMARY OF THE INVENTION

The present invention has been made in light of the foregoing problems associated with the conventional art. It is therefore an object of the present invention to provide an integrated semiconductor light-emitting device and a manufacturing method thereof capable of enhancing mass productivity and improving the optical properties, the electric properties and the like.

Another object of the present invention is to provide an integrated semiconductor light-emitting device and a manufacturing method thereof suitable for being mounted on a pickup provided in an information recording/reproducing system or the like.

According to a first aspect of the present invention, an integrated semiconductor light-emitting device emitting a plurality of laser lights differing in wavelength, comprises a first laser part stacked on a semiconductor substrate, a second laser part with a projection shape formed by stack in thin-film-layer form, a trench for receiving the second laser part therein, the trench being formed adjacent to the first laser part on the semiconductor substrate, and a bonding layer for bonding together at least the first laser part, the second laser part and the trench.

According to a second aspect of the present invention, respective emission spots of the first laser part and the second laser part are located away in approximately a same horizontal direction perpendicular to a direction of stack of the first and second laser parts.

According to a third aspect of the present invention, in a direction perpendicular to a direction of stack of the first and second laser parts, an occupation area of the semiconductor substrate is greater than a bonded area of at least the first laser part, the second laser part and the trench, and the bonding layer extends onto the semiconductor substrate based on a difference in area between the bonded area and the occupation area.

According to a fourth aspect of the present invention, the integrated semiconductor light-emitting device further comprises an electric insulation film formed at least on the first laser part and an inside surface of the trench, and an electrode metal layer stacked on the electric insulation film to cover the film.

According to a fifth aspect of the present invention, a method for manufacturing an integrated semiconductor light-emitting device emitting a plurality of laser lights differing in wavelength, comprises the steps of making a first laser wafer having first laser parts and recess-shaped trenches formed on a semiconductor substrate, and having a bonding layer consisting of metal and provided on at least the first laser part and the trench, making a second laser wafer having projection-shaped second laser parts formed on a support substrate, fitting the second laser part into the trench, and bonding the first laser wafer and the second laser wafer together through the bonding layer, and removing the support substrate from the second laser parts.

According to a sixth aspect of the present invention, in the bonding step for bonding the first and second laser wafer together, an emission spot of the first laser part and an emission spot of the second laser part are aligned in approximately a same horizontal direction perpendicular to a direction of stack of the first and second laser parts when the first and second laser wafers are bonded through the bonding layer.

According to a seventh aspect of the present invention, in the making step for making the first laser wafer, a rise portion in addition to the first laser part and the trench, having a height substantially equal to the first laser part is formed opposite the first laser part through the trench, and further the bonding layer is formed at least on an entire surface of the first laser part, the trench and the rise portion.

According to an eighth aspect of the present invention, in the making step of the first laser wafer, a stage portion in addition to the first laser part and the trench, having a height substantially equal to the first laser part is formed opposite the first laser part through the trench, and further the bonding layer is formed at least on the first laser part, the trench and a portion of the stage portion.

According to a ninth aspect of the present invention, in the removing step for removing the support substrate from the second laser parts, a predetermined light is irradiated from a backside of the support substrate to decompose an interface of the second laser parts adjoining the support substrate, so that the support substrate can be removed from the second laser parts.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Preferred embodiments according to the present invention will be described below with reference to the accompanying drawings.

Figure 1:
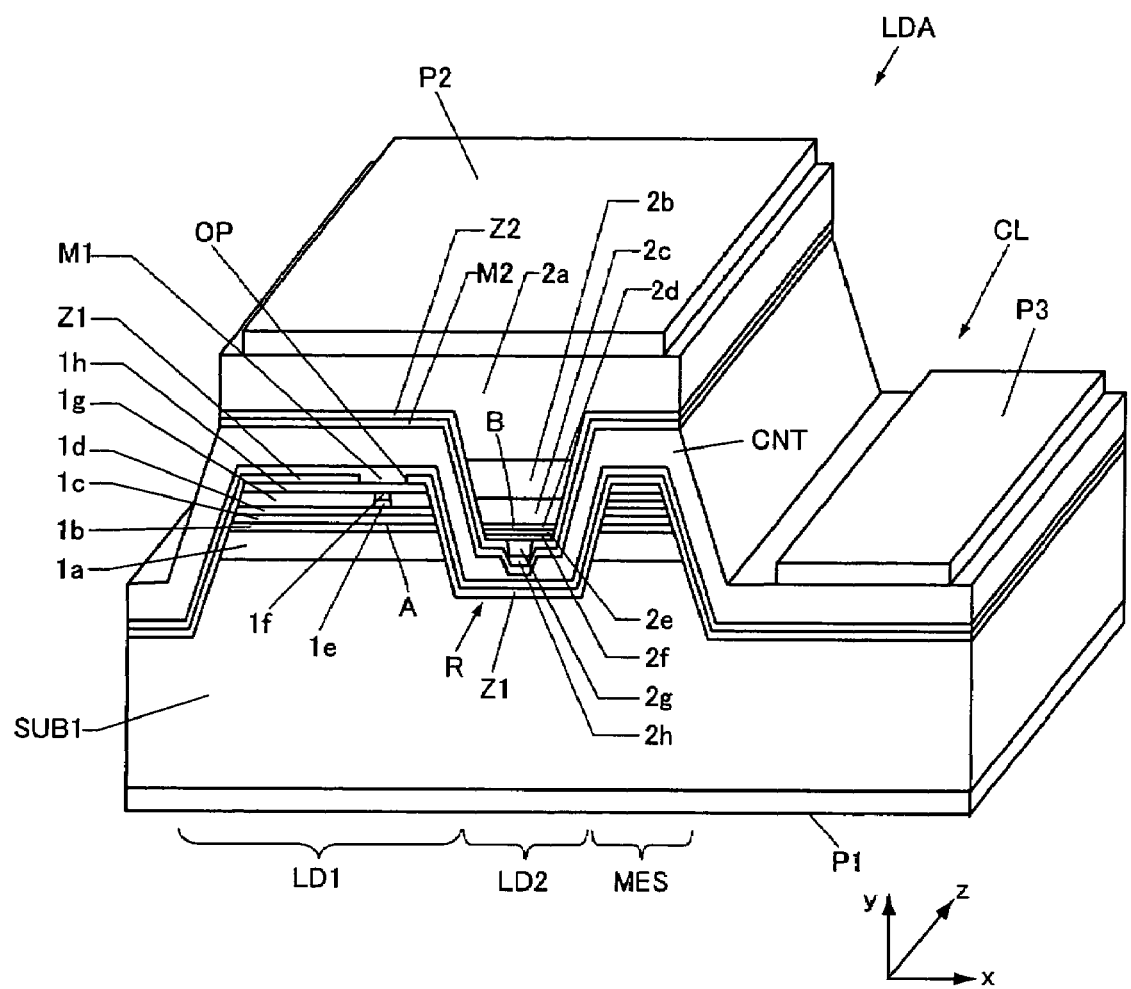
FIG. 1 is a schematically perspective view illustrating the structure of an integrated semiconductor light-emitting device according to a first embodiment.
Figure 2:
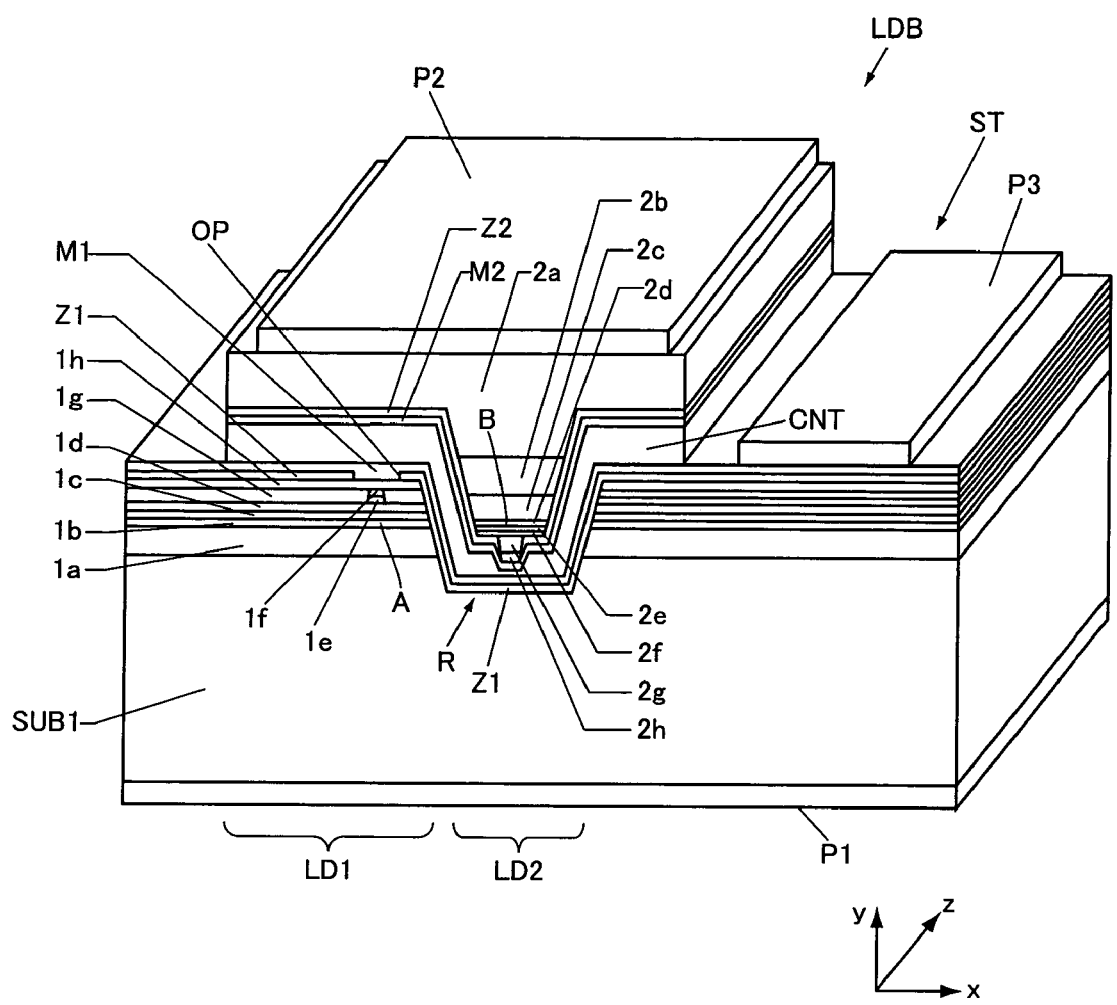
FIG. 2 is a schematically perspective view illustrating the structure of an integrated semiconductor light-emitting device according to a second embodiment.
Figure 3A:
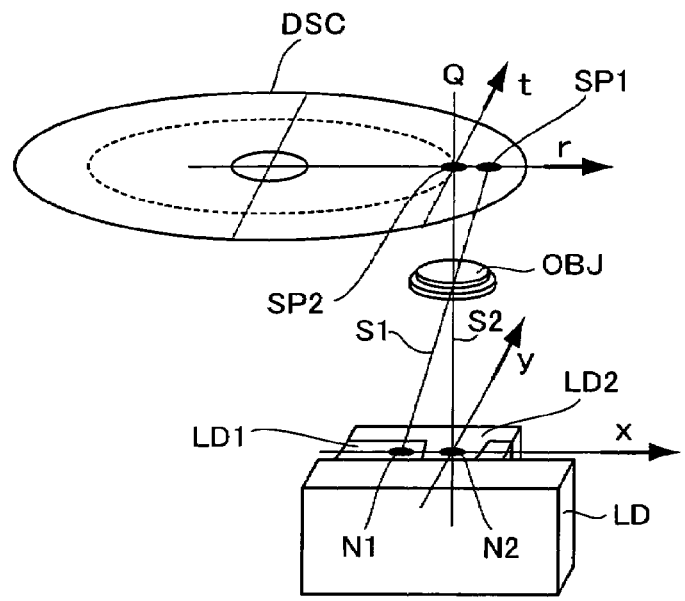
FIGS. 3A and 3B are diagrams for explaining effects of the integrated semiconductor light-emitting device in the first and second embodiments.
Figure 3B:
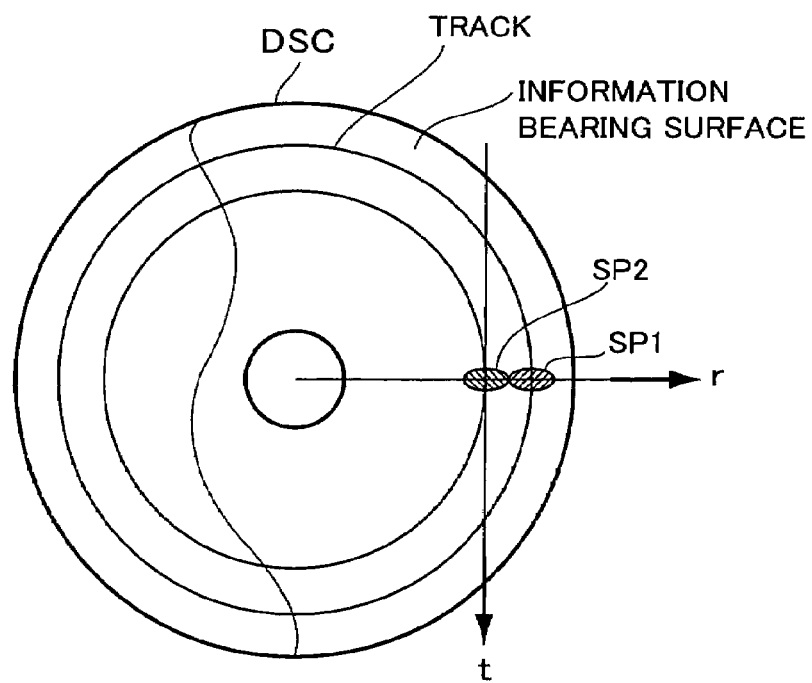

FIG. 1 is a schematically perspective view illustrating the outward appearance of structure of an integrated semiconductor light-emitting device according to a first embodiment. FIG. 2 is a schematically perspective view illustrating the outward appearance of structure of an integrated semiconductor light-emitting device according to a second embodiment. FIGS. 3A and 3B are diagrams for explaining the effects provided by mounting the integrated semiconductor light-emitting device in the first and second embodiments on a pickup.

First Embodiment

FIG. 1 shows an integrated semiconductor light-emitting device LDA having a first laser part LD1, a rise MES, a trench R formed between the first laser part LD1 and the rise MES, a stage CL adjacent to the rise MES, and a second laser part LD2. A metal bonding layer CNT is formed on the first laser part LD1, the trench R, the rise MES and the stage CL, and the second laser part LD2 is fitted into the trench R through the bonding layer CNT.

The horizontal direction (width direction) x of an MQW active layer $1b$ formed in the first laser part LD1 is substantially consistent with that of an MQW active layer $2d$ formed in the second laser part LD2.

The first laser part LD1 is formed of a II-VI compound semiconductor or a III-V compound semiconductor including any of arsenic (As), phosphorus (P) and antimony (Sb) as a group V element. The first laser part LD1 has an n-type cladding layer $1a$, MQW active layer $1b$, first p-type cladding layer $1c$, p-type etch stopping layer $1d$, stripe-shaped second p-type cladding layer $1e$, stripe-shaped p-type intermediate layer $1f$, n-type current blocking layer $1g$, p-type contact layer $1h$, insulating film Z1, and a p-electrode metal layer M1 which are stacked in this order on an n-type semiconductor substrate SUB1.

The second p-type cladding layer 1e and the p-type intermediate layer 1f stacked on the top of the second cladding layer 1e are formed in a stripe shape elongated in the depth direction z in FIG. 1. The n-type current blocking layer 1g is formed on both sides of the stack of the second p-type cladding layer 1e and p-type intermediate layer 1f. The p-type contact layer 1h is formed on the total surface of both the p-type intermediate layer 1f and the n-type current blocking layer 1g. The second p-type cladding layer 1e, the p-type intermediate layer 1f and the n-type current blocking layer 1g form a buried-type current confinement portion.

As shown in FIG. 1, an electric insulating layer Z1 is formed to provide electric insulation on each of the above layers 1a to 1e and further on the rise MES, the trench R in which the n-type semiconductor substrate SUB1 is exposed, and the stage CL. Because the thickness of the insulating layer Z1 especially in the trench R and the stage CL reaches the n-type semiconductor substrate SUB1, the exposed portion of the n-type semiconductor substrate SUB1 is covered with the insulating layer Z1 for accomplishing the prevention of current leakage from the electrode metal M1 into the n-type semiconductor substrate SUB1. Note that an opening window OP is formed in the insulating layer Z1, and is slightly larger than and opposite to the stripe-shaped p-type intermediate layer 1f. The p-electrode metal layer M1 is connected to the p-type contact layer 1h through the opening window OP, and formed on the entire surface of the insulating layer Z1. The p-electrode metal layer M1 and the bonding layer CNT are bonded together.

The rise MES has a multiple thin-film layer including the n-type cladding layer 1a, MQW active layer 1b, first p-type cladding layer 1c, p-type etch stopping layer 1d, n-type current blocking layer 1g and the p-type contact layer 1h which are stacked on the n-type semiconductor substrate SUB1 at the same time when the first laser part LD1 is formed. More specifically, predetermined regions of the above thin-film layer stacked on the n-type semiconductor substrate SUB1 are etched to form the trench R and the stage CL which are elongated in the depth direction z. Then, the insulating layer Z1 and the p-electrode metal layer M1 are stacked on the remaining projection between the trench R and the stage CL to form the rise MES extending in the depth direction z.

The trench R formed by etching one of the predetermined regions of the thin-film layer to reach the n-type semiconductor substrate SUB1 is formed in a groove shape for receiving the second laser part LD2 which is fitted thereto. The insulating layer Z1 and the p-electrode metal layer M1 are stacked on the trench R.

The stage CL formed by etching another predetermined region of the thin-film layer to reach the n-type semiconductor substrate SUB1 is adjacent to the rise MES. The insulating layer Z1 and the p-electrode metal layer M1 are stacked on the stage CL.

The second laser part LD2 is formed of a III-V compound semiconductor including nitrogen (N) of a group V element. The second laser part LD2 includes an n-type cladding layer 2b, an n-type guiding layer 2c, an MQW active layer 2d, a p-type electron barrier layer 2e, a p-type guiding layer 2f, a p-type cladding layer 2g of a ridge strip structure elongated in the depth direction z, a p-type contact layer 2h of a ridge strip structure elongated in the depth direction z, an electric insulating layer Z2, and a p-electrode metal layer M2 which are stacked in this order on an n-type base layer 2a.

The region exclusive of the top of the p-type contact layer 2h is covered with the insulating layer Z2 for electric insulation. The p-electrode metal layer M2 is electrically connected to the top of the p-type contact layer 2h and is formed on the entire surface of the insulating layer Z2.

The bonding layer CNT is formed in a predetermined thickness on the entire surface of the p-electrode metal layer M1 which is formed on the first laser part LD1, trench R, rise MES and the stage CL, and bonded with the p-electrode metal layer M2 of the second laser part LD2. The surface area of the n-type semiconductor substrate SUB1 is wider than the bonded area of the bonding layer CNT to the first laser part LD1, the rise MES, the second laser part LD2 and the n-type base layer 2a for the second laser part LD2. The bonding layer CNT extends over the stage CL generated because of the difference in area between the bonded area and the surface area.

An n-electrode P1 is formed on the bottom face of the n-type semiconductor substrate SUB1 in FIG. 1. An n-electrode P2 is formed on the top face of the n-type base layer 2a in FIG. 1. A p-electrode pad P3 is formed on a surface of the bonding layer CNT and on the stage CL.

Upon the supply of drive current (forward current) between the p-electrode pad P3 and the n-electrode P1, the drive current flows throughout the bonding layer CNT. The drive current then flows through the p-electrode metal layer M1 from the opening window OP formed in the insulating layer Z1 to be supplied into the p-type contact layer 1h, the stripe-shaped p-type intermediate layer 1f and the stripe-shaped second p-type cladding layer 1e, resulting in current confinement. The drive current thus confined in the stripe shape flows into the MQW active layer 1b, thereby causing laser oscillation. A red laser light with a predetermined wavelength (e.g. 650 nm band) is emitted from the cleaved facet of the MQW active layer 1b, namely, an emission spot A of the first laser part LD1.

Upon the supply of drive current (forward current) between the p-electrode pad P3 and the n-electrode P2, the drive current flows throughout the bonding layer CNT. The drive current then flows through the p-electrode metal layer M2 to be supplied into the p-type contact layer 2h and the p-type guiding layer 2g which are of the ridge stripe structure, resulting in current confinement. The drive current thus confined in the stripe shape flows into the MQW active layer 2d, thereby causing laser oscillation. A blue laser light with a predetermined wavelength (e.g. 405 nm band) is emitted from the cleaved facet of the MQW active layer 2d, namely, an emission spot B of the second laser part LD2.

In the integrated semiconductor light-emitting device LDA having the foregoing structure, the second laser part LD2 is fitted into the trench R between the first laser part LD1 and the rise MES, and bonded with the bonding layer CNT. Hence, in the manufacturing process for the integrated semiconductor light-emitting device LDA, the positioning of the emission spots A and B of the first and second laser parts LD1 and LD2 is obtained with high accuracy. In consequence, it is possible to manufacture the integrated semiconductor light-emitting device LDA with a uniform distance between the emission spots which is capable of achieving high quality reproduction.

In the foregoing multiple wavelength laser device LDA, the bonding surface between the first and second laser parts LD1 and LD2 is not flat, and uneven because of the ridge stripe shape and the like as described earlier. However, the metal bonding layer CNT used for bonding the laser parts LD1 and LD2 together is deformable, and therefore the laser parts LD1 and LD2 can be bonded together in a high degree of absolute contact.

Thus, the first and second laser parts LD1 and LD2 can be bonded together with high precision positioning of the emission spots A and B of the first and second laser parts LD1 and LD2, leading to the integrated semiconductor light-emitting devices LDA with uniform distance between the emission spots.

When drive current is supplied from the p-electrode pad P3, the drive current flows through the metal bonding layer CNT of a high electric conductivity into the first laser part LD1 or the second laser part LD2. For this reason, a reduction in drive voltage and electric power consumption reduces a size of radiator.

Further, in the first embodiment, the first laser part LD1 is of the buried type with a flat surface, and the second laser part LD2 is of the ridge stripe type with an uneven surface. However, even if both the first and second laser parts LD1 and LD2 are of the ridge stripe type, the laser parts LD1 and LD2 can be bonded together with high precision positioning of the emission spots by use of the metal bonding layer CNT. This is not limited to the laser part, but even if the bonding surface of any portion is uneven, bonding with high precision positioning of the emission spots is possible by means of fusion of the metal boding layer CNT. Alternatively, even if both the first and second laser parts LD1 and LD2 are of the buried type with a flat surface, the same effects can be obtained.

The emission spots A and B of the first and second laser parts LD1 and LD2 bonded together by the metal bonding layer CNT are spaced from each other in approximately the same plane in the horizontal direction (width direction) x. When this integrated semiconductor light-emitting device LDA is mounted on a pickup provided in an information recording/reproducing system such as a DVD player, the following effects are yielded.

The near field patterns (NFP) N1, N2 of the laser lights S1, S2 respectively emitted from the emission spots A and B have an oval shape with a short diameter in the vertical direction (thickness direction) y of the active layers 1b, 2d and a long diameter in the horizontal direction (width direction) x of the active layers 1b, 2d as shown in FIG. 3A.

When the laser light emitted from the oval-shaped NFP is focused on the signal recording layer of the optical disc DSC, because of the effect of the NFP shape, the focused spots SP1, SP2 also have an oval shape with the short diameter in the vertical direction (thickness direction) y of the active layer 1b, 2d and the long diameter in the horizontal direction (width direction) x of the active layer 1b, 2d. This is for the following reason.

Typically, the shape of laser light emitted from a laser device is called a far field pattern (FFP) Contrary to the case of NFP, the FFP of the laser light emitted from the oval-shaped NFP has an oval shape with a long diameter in the vertical direction (thickness direction) y of the active layer 1b, 2d and a short diameter in the horizontal direction (width direction) x of the active layer 1b, 2d.

In the case when the laser light having the oval-shaped FFP with the long diameter in the vertical direction y and the short diameter in the horizontal direction x is focused on the signal recording layer of the optical disc by the use of the circular-shaped objective lens OBJ, the effective passage of the light output emitted from the laser device through the objective lens OBJ to concentrate the light output on the signal recording layer of the optical disc without loss is critical to an increase in recording/reproducing speed of the optical disc system.

In order for the light output emitted from the laser device to effectively pass through the objective lens OBJ, a desirable optical design involves the relationship in which all the oval-shaped FFP of the emitted laser light fall within the objective lens OBJ. However, this design needs the long diameter of the oval shape of FFP equal to or less than a diameter of the objective lens OBJ. As the next logical step, the short diameter of the FFP becomes significantly shorter than the diameter of the objective lens OBJ.

This results in that the inherent numerical aperture (NA) decreases substantially in the direction of the short diameter of the FFP (i.e. the direction x of the long diameter of the NFP), comparing with that of the objective lens OBJ. The diameter D of the focused spot is determined by $D = k\lambda/NA$, where $\lambda$ is a wavelength of laser light and k is a constant. Therefore, if the foregoing optical design is carried out, a focused spot system Dx in the direction of the short diameter of the FFP (the direction x of the long diameter of the NFP) and a focused spot system Dy in the direction of the long diameter of the FFP (the direction y of the short diameter of the NFP) has the relationship of Dx>Dy because of the effect of the substantial NA. Thereby, the focused spots SP1, SP2 result in an oval shape with a short diameter in the vertical direction (thickness direction) y of the active layers 1b, 2d and a long diameter in the horizontal direction (width direction) x of the active layers 1b, 2d.

For the foregoing reason, both the focused spots SP1 and SP2 have an oval shape.

Suppose that the optical disc DSC shown in FIG. 3A is a DVD, the laser part LD1 for the DVD emits a 650 nm red laser light, and the laser part LD2 for a high density optical disc emits a 405 nm blue laser light. When recording/reproducing information on the optical disc DSC which is a DVD, the laser part LD1 is driven to converge the laser light S1 on the signal recording layer of the optical disc DSC as shown by the focused spot SP1. In the case of a DVD, it is required to make the short diameter of the oval-shaped focused spot SP1 on the signal recording layer of the optical disc DSC and the tangential direction t to a track of the optical disc DSC be consistent with each other as shown in FIG. 3B so as to enable the high density recording.

Then, when the integrated semiconductor light-emitting device LDA is mounted on a pickup in accordance with the requirement, it is required to be mounted on the pickup in the positioning where the vertical direction y of the integrated semiconductor light-emitting device LDA and the tangential direction to the track of the optical disc DSC are respectively consistent.

On the other hand, for the case of a high density optical disc using a 405 nm blue laser light, a more rigorous design than that of a DVD is required from a viewpoint of the occurrence of aberration in the pickup optical system. For this requirement, the laser-light emitting portion N2 (i.e. the emission spot B) of the laser part LD2 is preferably located with respect to the optical axis center Q of the objective lens. As a consequence, when DVD is recorded/reproduced, the laser light S1 from the laser part LD1 enters the optical disc DSC at any angle other than a right angle. This incident angle of the laser light S1 causes comatic aberration to occur in the focused spot SP1, leading to an undesirable decline in the quality of optical spot.

However, a typical pickup is equipped with a tilt correction mechanism for correction of an angle deviation between a disc surface and the optical axis of the objective lens which occurs from disc warpage or the like. The tilt correction mechanism includes an angle adjustment mechanism for adjusting the angle of the objective lens in the radial direction r of the optical disc DCS. Thus, it is possible to correct the comatic aberration occurring in the focused spot SP1 by using the mechanism.

In other words, in the case where the integrated semiconductor light-emitting device LDA is mounted on the pickup, because the emission spots of the laser parts LD1 and LD2 are arranged parallel to the radial direction r of the optical disc DSC. Then, using the tilt correction mechanism provided with the pickup, it is possible to offer high quality focused spots for both the DVDs and high density optical discs.

As described above, when the integrated semiconductor light-emitting device LDA is mounted on the pickup provided in an information recording/reproducing system, the advantageous use of the functions of the tilt correction mechanism can cause the superior effect such as a decrease in component number, cost reduction, or high reliability of an information recording/reproducing system without addition of any additional optical components.

In addition, the integrated semiconductor light-emitting device LDA according to the first embodiment illustrated in FIG. 1 has the bonding layer CNT extending to the stage CL on the n-type semiconductor substrate SUB1. However, it is possible for the bonding layer CNT to bond between the bonding surfaces of only a range corresponding to, at the minimum, the first laser part LD1, the trench R, the rise MES and the second laser part LD2, so that the bonding layer CNT need not extend to the stage CL. In this case, the p-electrode pad P3 for supplying drive current to the first and second laser parts LD1 and LD2 can be formed on a portion of the p-electrode metal layer M1 which is exposed at the stage CL as a result of the bonding layer CNT not being extended to the stage CL.

Second Embodiment

Next, an integrated semiconductor light-emitting device according to a second embodiment will be described with reference to FIG. 2. In FIG. 2, the same components as or corresponding components to those shown in FIG. 1 are designated with the same reference numerals as in FIG. 1.

In FIG. 2, the integrated semiconductor light-emitting device LDB has a first laser part LD1, a flat portion ST, a trench R formed in a hollow shape on the surfaces of the first laser part LD1 and the flat portion ST, and a projection-shaped second laser part LD2. The second laser part LD2 is fitted into the trench R through a metal bonding layer CNT. The first laser part LD1 and the flat portion ST have the flat surfaces of a table-like shape and are formed of a II-VI compound semiconductor or a III-V compound semiconductor including any of arsenic (As), phosphorus (P) and antimony (Sb) as a group V element. The projection-shaped second laser part LD2 is formed of a III-V compound semiconductor including nitrogen (N) as a group V element.

The horizontal direction (width direction) x of an MQW active layer 1b formed in the first laser part LD1 is substantially consistent with that of an MQW active layer 2d formed in the second laser part LD2.

As in the case of the first laser part LD1 illustrated in FIG. 1, the first laser part LD1 in FIG. 2 has an n-type cladding layer 1a, MQW active layer 1b, first p-type cladding layer 1c, p-type etch stopping layer 1d, stripe-shaped second p-type cladding layer 1e, stripe-shaped p-type intermediate layer 1f, n-type current blocking layer 1g, p-type contact layer 1h, insulating film Z1, and a p-electrode metal layer M1 which are stacked in this order on an n-type semiconductor substrate SUB1. The structure of the first laser part LD1 has a buried-type current confinement portion.

The flat portion ST has a multiple thin-film layer including the n-type cladding layer 1a, MQW active layer 1b, first p-type cladding layer 1c, p-type etch stopping layer 1d, n-type current blocking layer 1g and the p-type contact layer 1h which are stacked on the n-type semiconductor substrate SUB1 at the same time when the first laser part LD1 is formed. The insulating film Z1 and the p-electrode metal layer M1 are stacked on the thin-film layer.

The first embodiment has described the stage CL (see FIG. 1) formed by etching the predetermined region of the thin-film layer stacked on the n-type semiconductor substrate SUB1, whereas in the second embodiment, the corresponding region of the thin-film layer is not etched and thus is used for forming the table-like flat portion ST having the same height as that of the first laser part LD1 extending from the n-type semiconductor substrate SUB1 to their surfaces.

For the forming of the trench R, a predetermined region of the thin-film layer stacked on the n-type semiconductor substrate SUB1 at the time when the first laser part LD1 is formed is etched to reach the n-type semiconductor substrate SUB1. The trench R is formed in a recess shape for receiving the second laser part LD2 which is fitted therein. The insulating layer Z1 and the p-electrode metal layer M1 are stacked on the trench R.

The second laser part LD2 is a ridge stripe type laser part as in the case of the second laser part LD2 illustrated in FIG. 1. The second laser part LD2 in the second embodiment includes an n-type cladding layer 2b, n-type guiding layer 2c, MQW active layer 2d, p-type electron barrier layer 2e, p-type guiding layer 2f, p-type cladding layer 2g of a ridge strip structure elongated in the depth direction z, p-type contact layer 2h of a ridge strip structure elongated in the depth direction z, insulating layer Z2, and a p-electrode metal layer M2 which are stacked in this order on an n-type base layer 2a. The region exclusive of the top of the p-type contact layer 2h is covered with the insulating layer Z2 for electric insulation. The p-electrode metal layer M2 is electrically connected to the top of the p-type contact layer 2h and is formed on the entire surface of the insulating layer Z2.

The bonding layer CNT is formed with a predetermined thickness on the p-electrode metal layer M1 which is formed on the trench R, and on the first laser part LD1 and a predetermined region which are located on opposite sides of the trench R. The bonding layer CNT is bonded combinedly to the p-electrode metal layer M2 of the second laser part LD2.

The surface area of the n-type semiconductor substrate SUB1 is wider than the bonded area of the bonding layer CNT to the first laser part LD1, a part of the flat portion ST, the second laser part LD2 and the n-type base layer 2a for the second laser part LD2. The p-electrode metal layer M1 extends over the flat portion ST generated because of the difference in area between the bonded area and the surface area.

In FIG. 2, an n-electrode P1 is formed on the bottom face of the n-type semiconductor substrate SUB1, an n-electrode P2 is formed on the top face of the n-type base layer 2a, and a p-electrode pad P3 is formed on a portion of the p-electrode metal layer M1 on the flat portion ST.

Upon the supply of drive current (forward current) between the p-electrode pad P3 and the n-electrode P1, the drive current flows throughout the p-electrode metal layer M1 and the bonding layer CNT. The drive current then flows through the p-electrode metal layer M1 from the opening window OP formed in the insulating layer Z1 to be supplied into the p-type contact layer 1h, the stripe-shaped p-type intermediate layer 1f and the stripe-shaped second p-type cladding layer 1e, resulting in current confinement. The drive current thus confined in the stripe shape flows into the MQW active layer 1b, thereby causing laser oscillation. A red laser light with a predetermined wavelength (e.g. 650 nm band) is emitted from the cleaved facet of the MQW active layer 1b, namely, an emission spot A of the first laser part LD1.

Upon the supply of drive current (forward current) between the p-electrode pad P3 and the n-electrode P2, the drive current flows throughout the ohmic electrode layer M1 and the bonding layer CNT. The drive current then flows through the p-electrode metal layer M2 to be supplied into the p-type contact layer 2h and the p-type guiding layer 2g which are of the ridge stripe structure, resulting in current confinement. The drive current thus confined in the stripe shape flows into the MQW active layer 2d, thereby causing laser oscillation. A blue laser light with a predetermined wavelength (e.g. 405 nm band) is emitted from the cleaved facet of the MQW active layer 2d, namely, an emission spot B of the second laser part LD2.

Regarding the difference in structure between the integrated semiconductor light-emitting devices LDA and LDB as described above, the integrated semiconductor light-emitting device LDB has the structure in which the trench R receiving the second laser part LD2 which is fitted therein is formed in the predetermined region of the thin-film layer stacked on the n-type semiconductor substrate SUB1, and the p-electrode pad P3 is formed on the portion of the p-electrode metal layer M1 corresponding to the flat portion ST. On the other hand, in the integrated semiconductor light-emitting device LDA shown in FIG. 1, the stage CL and the trench R receiving the second laser part LD2 which is fitted therein are formed in the predetermined regions of the thin-film layer stacked on the n-type semiconductor substrate SUB1, so that the first laser part LD1 is spaced from the stage CL, and the p-electrode pad P3 is formed on the portion of the bonding layer CNT corresponding to the stage CL.

In the integrated semiconductor light-emitting device LDB having the foregoing structure, the projection-shaped second laser part LD2 is fitted into the trench R which is formed between the first laser part LD1 and the flat portion ST, and bonded with the bonding layer CNT. Hence, in the manufacturing process for the integrated semiconductor light-emitting device LDB, the positioning of the emission spots A and B of the first and second laser parts LD1 and LD2 is obtained with high accuracy. In consequence, it is possible to manufacture the integrated semiconductor light-emitting device LDB with a uniform distance between the emission spots which is capable of achieving high quality reproduction.

In the foregoing multiple wavelength laser device LDB, the bonding surface between the first and second laser parts LD1 and LD2 is not flat, but uneven because of the ridge stripe shape as described earlier. However, the metal bonding layer CNT used for boding is deformable, and therefore the laser parts LD1 and LD2 can be bonded together in a high degree of absolute contact.

Thus, the first and second laser parts LD1 and LD2 can be bonded together with high precision positioning of the emission spots A and B of the first and second laser parts LD1 and LD2, leading to an integrated semiconductor light-emitting device LDB with uniform distance between the emission spots.

The drive current supplied to the p-electrode pad P3 flows through the p-electrode layer M1 and the metal bonding layer CNT into the first laser part LD1 or the second laser part LD2. For this reason, a reduction in electric power consumption is obtained with the effect of eliminating the need of a large-sized heat dissipating structure.

Further, as in the case of the first embodiment, even if both the first and second laser parts LD1 and LD2 are of the ridge stripe type, the laser parts LD1 and LD2 can be bonded together with high precision positioning of the emission spots by means of fusion of the metal bonding layer CNT. This is not limited to the laser part, but even if the bonding surface of any portion is uneven, bonding with high precision positioning of the emission spots is possible by means of fusion of the metal boding layer CNT.

When the integrated semiconductor light-emitting device LDB is mounted on a pickup provided in an information recording/reproducing system such as a DVD player, the following effects are obtained.

More specifically, the near field patterns (NFP) N1, N2 of the laser lights S1, S2 respectively emitted from the emission spots A and B have an oval shape with a short diameter in the vertical direction (thickness direction) y of the active layers 1b, 2d and a long diameter in the horizontal direction (width direction) x of the active layers 1b, 2d as shown in FIG. 3A. When the laser light emitted from the oval-shaped NFP is focused on the signal recording layer of the optical disc DSC, because of the effect of the NFP shape, the focused spots SP1, SP2 also have an oval shape with the short diameter in the vertical direction (thickness direction) y of the active layer 1b, 2d and the long diameter in the horizontal direction (width direction) x of the active layer 1b, 2d. This is for the following reason.

Typically, the shape of laser light emitted from a laser device is called a far field pattern (FFP). Contrary to the case of NFP, the FFP of the laser light emitted from the oval-shaped NFP has an oval shape with a long diameter in the vertical direction (thickness direction) y of the active layer 1b, 2d and a short diameter in the horizontal direction (width direction) x of the active layer 1b, 2d.

In the case when the laser light having the oval-shaped FFP with the long diameter in the vertical direction y and the short diameter in the horizontal direction x is focused on the signal recording layer of the optical disc by the use of the circular-shaped objective lens OBJ, the effective passage of the light output emitted from the laser device through the objective lens OBJ to concentrate the light output on the signal recording layer of the optical disc without loss is critical for high recording/reproducing speed of the optical disc system.

In order for the light output emitted from the laser device to effectively pass through the objective lens OBJ, a desirable optical design involves the relationship in which all the oval-shaped FFP of the emitted laser light fall within the objective lens OBJ. However, this design needs the long diameter of the oval shape of FFP equal to or less than a diameter of the objective lens OBJ. As the next logical step, the short diameter of the FFP becomes significantly shorter than the diameter of the objective lens.

This results in that the inherent numerical aperture (NA) decreases substantially in the direction of the short diameter of the FFP (i.e. the direction x of the long diameter of the NFP), comparing with that of the objective lens OBJ. The diameter D of the focused spot is determined by $D=k\lambda/NA$, where $\lambda$ is a wavelength of laser light and k is a constant. Therefore, if the foregoing optical design is carried out, a focused spot system Dx in the direction of the short diameter of the FFP (the direction x of the long diameter of the NFP) and a focused spot system Dy in the direction of the long diameter of the FFP (the direction y of the short diameter of the NFP) has the relationship of Dx>Dy because of the effect of the substantial NA. Thereby, the focused spots SP1, SP2 result in an oval shape with a short diameter in the vertical direction (thickness direction) y of the active layers 1b, 2d and a long diameter in the horizontal direction (width direction) x of the active layers 1b, 2d.

For the foregoing reason, both the focused spots SP1 and SP2 have an oval shape.

Suppose that the optical disc DSC shown in FIG. 3A is a DVD, the laser part LD1 for the DVD emits a 650 nm red laser light, and the laser part LD2 for a high density optical disc emits a 405 nm blue laser light. When recording/reproducing information on the optical disc DSC which is a DVD, the laser part LD1 is driven to converge the laser light S1 on the signal recording layer of the optical disc DSC as shown by the focused spot SP1.

In the case of a DVD, it is required to make the short diameter of the oval-shaped focused spot SP1 on the signal recording layer of the optical disc DSC and the tangential direction t to a track of the optical disc DSC be consistent with each other as shown in FIG. 3B so as to enable the high density recording.

Then, when the integrated semiconductor light-emitting device LDB is mounted on a pickup in accordance with the requirement, it is required to be mounted on the pickup in the positioning where the vertical direction y of the integrated semiconductor light-emitting device LDB and the tangential direction to the track of the optical disc DSC are respectively consistent.

On the other hand, for the case of a high density optical disc using a 405 nm blue laser light, a more rigorous design than that of a DVD is required from a viewpoint of the occurrence of aberration in the pickup optical system. For this requirement, the laser-light emitting portion N2 (i.e. the emission spot B) of the laser part LD2 is preferably located with respect to the optical axis center Q of the objective lens. As a consequence, when DVD is recorded/reproduced, the laser light S1 from the laser part LD1 enters the optical disc DSC at any angle other than a right angle. This incident angle of the laser light S1 causes comatic aberration to occur in the focused spot SP1, leading to an undesirable decline in the quality of optical spot.

However, a typical pickup is equipped with a tilt correction mechanism for correction of an angle deviation between a disc surface and the optical axis of the objective lens which occurs from disc warpage or the like. The tilt correction mechanism includes an angle adjustment mechanism for adjusting the angle of the objective lens in the radial direction r of the optical disc DCS. Thus, it is possible to correct the comatic aberration occurring in the focused spot SP1 by using the mechanism.

In other words, in the case where the integrated semiconductor light-emitting device LDB is mounted on the pickup, because the emission spots of the laser parts LD1 and LD2 are arranged parallel to the radial direction r of the optical disc DSC. Then, using the tilt correction mechanism provided with the pickup, it is possible to offer high quality focused spots for both the DVDs and high density optical discs.

As described above, when the integrated semiconductor light-emitting device LDB is mounted on the pickup provided in an information recording/reproducing system, the advantageous use of the functions of the tilt correction mechanism can cause the superior effect such as a decrease in component number, cost reduction, or high reliability of an information recording/reproducing system without addition of any additional optical components.

Third Embodiment

Next, a method for manufacturing the integrated semiconductor light-emitting device LDA illustrated in FIG. 1, according to the first embodiment of the present invention, will be described in detail with reference to FIGS. 4A to 6D as a third embodiment. FIGS. 4A to 6D are sectional views illustrating in the order of the steps of the manufacturing method for the integrated semiconductor light-emission device LDA, and the same components or regions as or the corresponding components or regions to those in FIG. 1 are designated with the same reference numerals as in FIG. 1.

In the third embodiment, a first laser wafer 100 with an n-type semiconductor substrate SUB1 on which a plurality of first laser parts LD1 are formed, and a second laser wafer 200 with a support substrate (e.g. sapphire substrate or AlN substrate) SUB2 on which a plurality of second laser parts LD2 are formed are prefabricated. The first and second laser wafers 100 and 200 are bonded together with a bonding layer CNT. Then, the support substrate SUB2 is removed by the use of the laser lift-off technique. After that, the bonded first and second laser wafers 100 and 200 are cleaved to form a plurality of integrated semiconductor light-emitting devices LDA.

The first laser wafer 100 is made in the following steps.

First, then-GaAs semiconductor substrate SUB1 is processed by MOCVD (metal-organic chemical vapor deposition) techniques for forming a multiple AlInGap-based semiconductor thin-film layer thereon, and then by photolithography for forming ridge-stripe geometry on the wafer surface. After that, MOCVD is performed again for burying the ridge stripe with the AlInGap-based semiconductor thin-film layer. Thus, the AlInGap-based semiconductor laser wafer as shown in FIG. 4A is fabricated.

More specifically, the n-type GaAs semiconductor substrate SUB1 undergoes the MOCVD process for inducing crystal growth thereon to form a n-type cladding layer 1a made of an n-AlInGaP, an MQW active layer 1b, a first p-type cladding layer 1c based on p-AlInGaP, a p-type etching stopping layer 1d based on p-InGaP, a second p-type cladding layer based on p-AlInGaP, and a p-type intermediate layer based on p-InGaP.

Figure 4A:
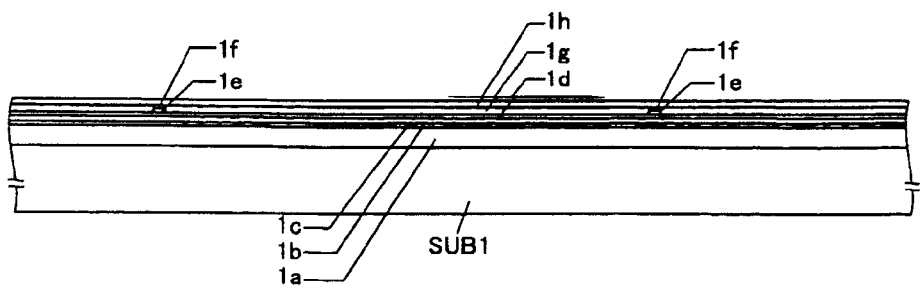
FIGS. 4A, 4B, 4C, 4D and 4E are sectional views illustrating a concrete method of manufacturing the integrated semiconductor light-emitting device shown in FIG. 1.

After that, as shown in FIG. 4A, the second p-type cladding layer and the p-type intermediate layer are shaped into 2 μm-wide strips each extending in the depth direction z (i.e. a direction perpendicular to the page of FIG. 4A) by the use of photolithography, so that a plurality of stacks of a second p-type cladding layer 1e and a p-type intermediate layer 1f are spaced at intervals of 1500 μm.

After this photolithography process, the n-type GaAs semiconductor substrate SUB1 undergoes the MOCVD process for inducing crystal growth thereon to form an n-type current blocking layer 1g including the n-GaAs layer and a p-type contact layer 1h based on p-GaAs. Thus, an AlInGap-based semiconductor laser wafer is fabricated as illustrated in FIG. 4A.

Figure 4B:
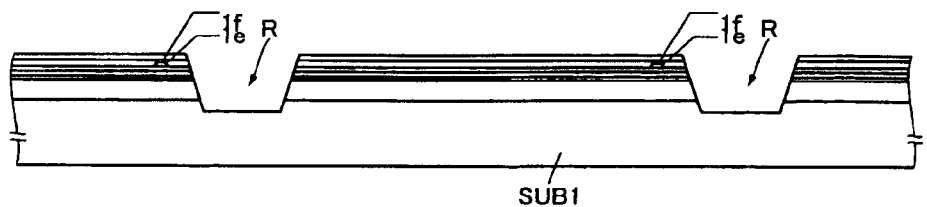

Then, as illustrated in FIG. 4B, predetermined regions of the thin-film layer are etched to reach the n-type GaAs semiconductor substrate SUB1 by the use of photolithography, in order to form a plurality of trenches R used for a plurality of first laser parts LD2, described later, which are fitted individually into the trenches R.

Each of the trenches R is about 4 μm in depth and about 15 μm in width. The trenches R are spaced at the same intervals as those of the layers 1e and 1f, and each extends parallel to and close to the stripe-shaped stack of the second p-type cladding layer 1e and the p-type intermediate layer 1f.

Figure 4C:
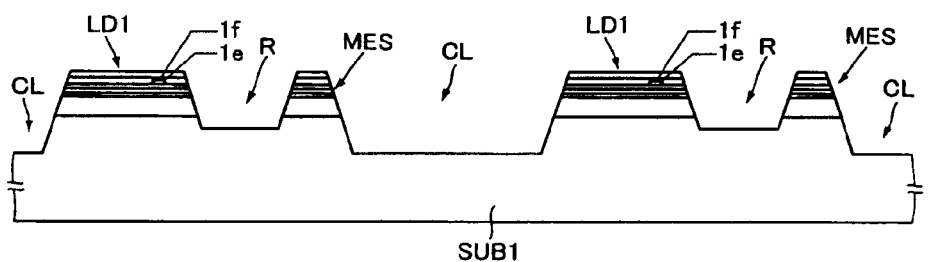

Then, as illustrated in FIG. 4C, other predetermined regions of the thin-film layer are etched to reach the n-type GaAs semiconductor substrate SUB1 by the use of photolithography, in order to form a plurality of groove-shaped stages CL each extending in the depth direction z (i.e. a direction perpendicular to the page of FIG. 4C).

Each of the stages CL is about 5 μm in depth and about 600 μm in width. The stages CL are spaced at the same intervals as those of the trenches R. Thereby, the region of the thin-film layer having the second p-type cladding layer 1e and the p-type intermediate layer 1f is set as the first laser part LD1. The region of the thin-film layer without the second p-type cladding layer 1e and the p-type intermediate layer 1f is set as the rise MES.

Figure 4D:
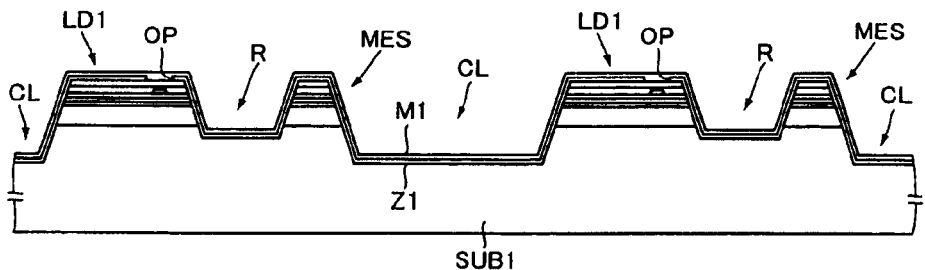

Next, as illustrated in FIG. 4D, an electric insulating film Z1 and a p-electrode metal layer M1 are stacked on the first laser part LD1, trench R, rise MES and the stage CL.

More specifically, the insulating film Z1 about 2000 Å thick comprising SiO$_2$ is deposited on the surfaces of the first laser part LD1, the trench R, the rise MES and the stage CL. Then, the insulating film Z1 is etched to remove a region thereof opposite to each stack of the p-type intermediate layer 1f and the second p-type cladding layer 1e. Each removed region is slightly greater in width than the layers 1e and 1f and forms a stripe-shaped opening window OP. Then, through a vacuum evaporation process, chromium (Cr) about 500 Å thick and gold (Au) about 2000 Å thick are deposited in order on all the surface of insulating film Z1 including the regions of the opening windows OP. Thus, a p-electrode metal layer M1 is formed to be in electric ohmic contact with the p-type contact layer 1h.

Figure 4E:
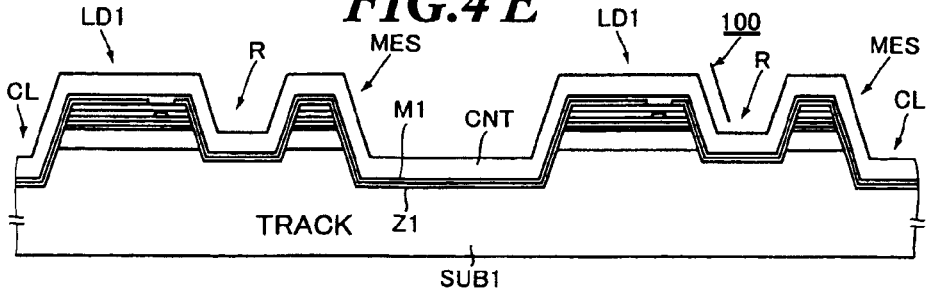
Figure 5:
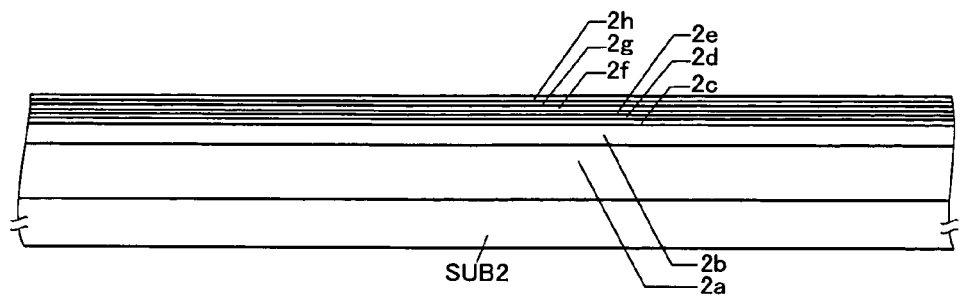
FIGS. 5A, 5B, 5C, 5D and 5E are sectional views further illustrating a concrete method of manufacturing the integrated semiconductor light-emitting device shown in FIG. 1.
Figure 5:
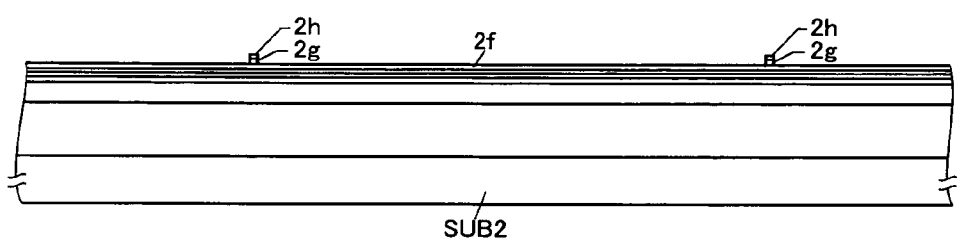
Figure 5:
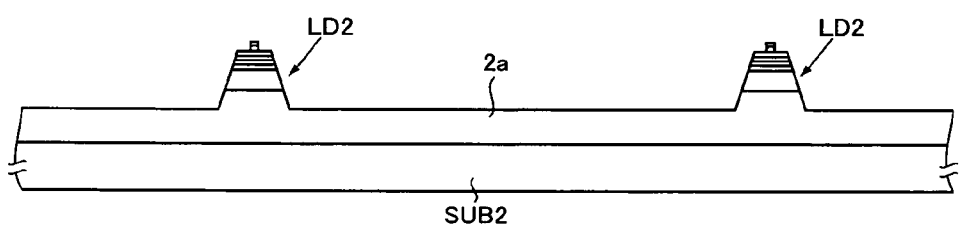
Figure 5:
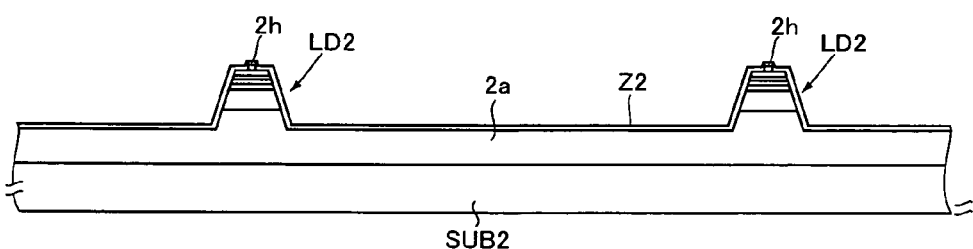
Figure 5:
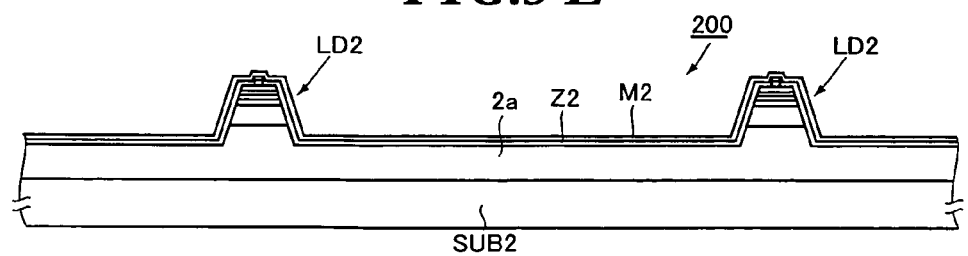
Figure 6:
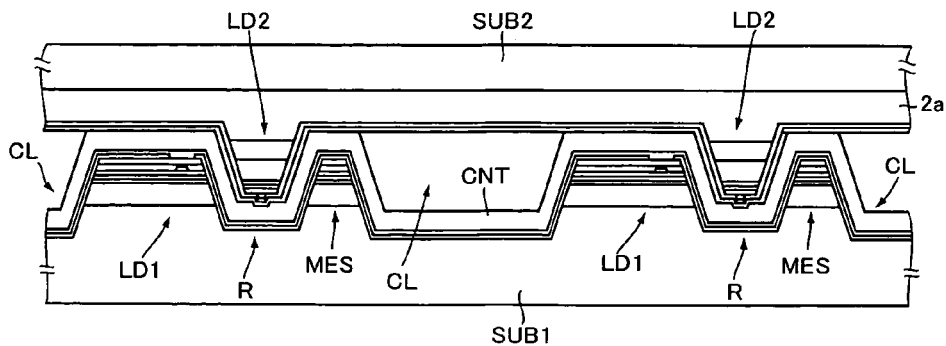
FIGS. 6A, 6B, 6C and 6D are sectional views illustrating yet further a concrete method of manufacturing the integrated semiconductor light-emitting device shown in FIG. 1.
Figure 6:
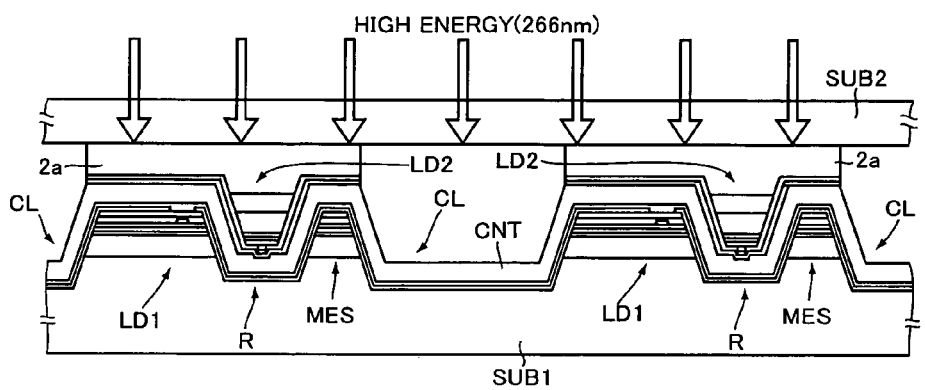
Figure 6:
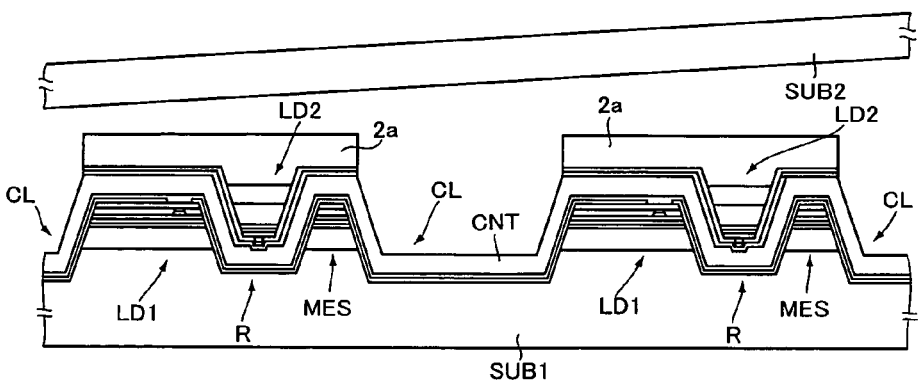
Figure 6:
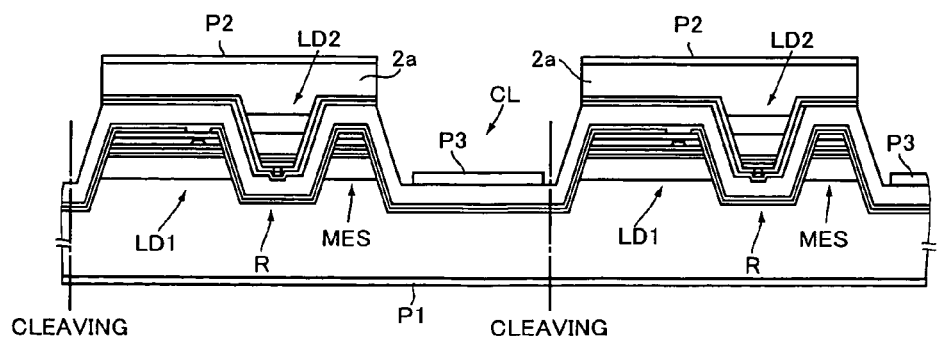

Then, as illustrated in FIG. 4E, a bonding layer CNT about 2 μm thick consisting of stannum (Sn) is deposited on the entire surface of the p-electrode metal layer M1 by vacuum evaporation, to complete the first laser wafer 100.

On the other hand, the second laser wafer 200 is fabricated in the following steps.

First, as illustrated in FIG. 5A, the support substrate SUB2 of the sapphire substrate or AlN substrate undergoes the MOCVD process to form a multiple thin-film GaN-based semiconductor layer thereon.

More specifically, an n-GaN-based n-type base layer 2a, an n-AlGaN-based n-type cladding layer 2b, an n-GaN-based n-type guiding layer 2c, an MQW active layer 2d, a p-AlGaN-based p-type electron barrier layer 2e, a p-GaN-based p-type guiding layer 2f, a p-AlGaN-based p-type cladding layer 2g, and a p-GaN-based p-type contact layer 2h are stacked in order on the support substrate SUB2.

Then, as illustrated in FIG. 5B, predetermined regions of the p-type contact layer 2h and the p-type cladding layer 2g are etched by the use of photolithography and RIE. The remaining regions of the p-type contact layer 2h and the p-type cladding layer 2g form a plurality of stripe-shaped ridge waveguides which are spaced at the same intervals as those of the trenches R illustrated in FIG. 4E. Each of the ridge waveguides is about 2 μm in width and about 0.6 μm in height, and extends in the depth direction z (i.e. a direction perpendicular to the page of FIG. 5B).

Then, as illustrated in FIG. 5C, by the use of photolithography and RIE, the region, except for the regions each having a width of about 10 μm including the described-above ridge waveguide, is etched from the p-type guiding layer 2f to an exposed face of the n-type base layer 2a. As a result of this etching process, a plurality of projection-shaped second laser parts LD2 are formed. The second laser part LD2 is about 10 μm in width and about 2 μm in height, and extends in the depth direction z.

Then, as illustrated in FIG. 5D, through a sputtering process, an SiO$_2$ insulating film Z2 about 2000 Å thick is deposited on the entire surfaces of the second laser parts LD2 and the n-type base layer 2a. After that, through an etching process, a stripe-shaped opening (the reference numeral is omitted) is formed in a portion of the insulating film Z2 corresponding to the top of each stripe-shaped p-type contact layer 2h.

Then, as illustrated in FIG. 5E, by vacuum evaporation, nickel (Ni) about 500 Å thick and gold (Au) about 2000 Å thick are deposited in order on the entire surface of the insulating film Z2 including the stripe-shaped openings (the reference numeral is omitted). Thus, a p-electrode metal layer M2 is formed to be in electric ohmic contact with the p-type contact layer 2h, resulting in the complete second laser wafer 200.

Next, the integrated semiconductor light-emitting device LDA is fabricated using the first and second laser wafers 100 and 200.

First, as illustrated in FIG. 6A, the second laser parts LD2 formed on the second laser wafer 200 are fitted into the corresponding trenches R formed in the first laser wafer 100 by the use of a jig. The first and second laser wafers 100 and 200 undergo heat treatment for about five minutes at about 310° C. in forming gas (a nitrogen-hydrogen mixture). As a result of the heat treatment, the Sn bonding layer CNT melts to attach together the first laser wafer 100 and the second laser wafer 200.

The stripe-shaped second p-type cladding layer 1e, the p-type intermediate layer 1f and the trench R, which are formed on the first laser wafer 100, are formed in a direction completely perpendicular to the cleavage of the AlInGap-based semiconductor crystal. Similarly, the ridge stripe and the second laser part LD2 on the second laser wafer 200 are formed in a direction completely perpendicular to the cleavage of the AlInGan-based semiconductor crystal.

For this reason, when the second laser part LD2 on the second laser wafer 200 is fitted into and bonded to the trench R formed in the first laser wafer 100, the cleavage of the first laser wafer 100 and the cleavage of the second laser wafer 200 are completely aligned.

Further, the MQW active layer 1b formed in the first laser part LD1 in the first laser wafer 100 and the MQW active layer 2d formed in the second laser part LD2 in the second laser wafer 200 are aligned on approximately the same plane in a horizontal direction.

Next, as illustrated in FIG. 6B, a high energy light with quadruple wavelength of YAG laser (i.e. 266 nm in wavelength) is irradiated from the back (i.e. the top in FIG. 6B) of the support substrate SUB2. The high energy light with the wavelength of 266 nm band passes through the support substrate SUB2 which is a sapphire substrate, and is absorbed by the n-type base layer 2a located around the interface adjoining the support substrate SUB2, so that GaN of the sapphire substrate interface is decomposed into metal gallium and nitrogen. Thereupon, the portion of the n-type base layer 2a which faces each stage CL on the first laser wafer 100 is destroyed and removed to the space created by the stage CL. Further, the bonding force decreases around the interface between the remaining portion of the n-type base layer 2a and the support substrate SUB2.

Next, as illustrated in FIG. 6C, the support substrate SUB2 weakened in the bonding force to the n-type base layer 2a is removed.

Then, as illustrated in FIG. 6D, the back (bottom in FIG. 6D) of the n-type semiconductor substrate SUB1 is polished until the thickness of the semiconductor substrate SUB1 becomes about 100 µm. After a damage layer created by the polishing is removed by the use of etchant such as sulfuric acid, an Au—Ge—Ni n-electrode P1 about 2000 Å thick is vapor-deposited on the back of the n-type semiconductor substrate SUB1. Further, the substantially exposed surface of the n-type base layer 2a on which the second laser part LD2 is provided is treated with hydrochloric acid or the like, and metal gallium and the like remaining on the treated surface are removed. Then, an n-type electrode P2 consisting essentially of Ti/Al or the like is vapor-deposited on the exposed surface. Further, a p-type electrode pad P3 consisting essentially of gold (Au) is vapor-deposited on a portion of the bonding layer CNT corresponding to each stage CL.

The integrated first and second laser parts LD1 and LD2 are cleaved in a direction perpendicular to the longitudinal direction of the ridge portion. At this point, the cleavage of the first laser wafer 100 which is the AlInGap-based semiconductor crystal forming the first laser part LD1, and the cleavage of the second laser wafer 200, which is the AlInGan-based semiconductor crystal forming the second laser part LD2, are completely aligned with each other as described earlier. Hence, the respective end faces of the first and second laser parts LD1 and LD2 which are obtained after the cleaving process are completely aligned on the same plane. After the above cleaving process, as illustrated in FIG. 6D, the n-type semiconductor substrate SUB1 is further cleaved along the longitudinal direction of the stage CL into chips to complete individual integrated semiconductor light-emitting devices LDA having the structure as shown in FIG. 1.

In FIG. 6D, because the cleaving for cutting up the substrate into chips is performed between the p-electrode pad P3 and the laser part LD1, the resulting multiple wavelength laser device has the laser part LD2 located between the p-electrode pad P3 and the laser part LD1. Alternatively, if the cleaving is performed between the p-electrode pad P3 and the rise MES, it is possible to fabricate a multiple wavelength laser device having the laser part LD1 located between the p-electrode pad P3 and the laser part LD2. Such a possibility allows a selection of a multiple wavelength laser device with an arrangement suited to a type of a pickup on which it is mounted.

In the manufacturing method in the third embodiment, the first laser wafer 100 having a plurality of first laser parts LD1 and the second laser wafer 200 having a plurality of second laser parts LD2 are bonded and combined together by the bonding layer CNT. Then, the high energy light with the quadruple wavelength of YAG laser (i.e. 266 nm in wavelength) is irradiated from the back of the support substrate SUB2 of the second laser wafer 200, whereby the support substrate SUB2 is removed. Then, the combined wafer is cut up through the cleaving process into a plurality of integrated semiconductor light-emitting devices LDA. Because of these processes, an improvement of mass productivity is obtained.

Further, when the first laser wafer 100 and the second laser wafer 200 are bonded, each of the projection-shaped second laser parts LD2 is fitted into the recess-shaped trench R formed between the first laser part LD1 and the rise MES, and then the bonding layer CNT bonds integrally them together. This manner provides high precision positioning of emission spots A and B in the first and second laser parts LD1 and LD2, leading to a fabrication of the integrated semiconductor light-emitting device LDA with uniform distance between the emission spots.

Although the bonding surfaces of the first and second laser parts LD1 and LD2 are not flat, but uneven because of the ridge stripe shape provided thereon or the like, the metal bonding layer CNT used for bonding is deformable, and therefore the first and second laser parts LD1 and LD2 can be bonded together in a high degree of tight contact.

This tight contact also makes it possible to provide the high precision positioning of the respective emission spots A and B of the first and second laser parts LD1 and LD2, leading to a fabrication of the integrated semiconductor light-emitting device LDA with uniform distance between the emission spots.

Further, in the manufacturing method in the third embodiment, the first laser part LD1 of the buried type with a flat surface, and the second laser part LD2 of the ridge stripe type with an uneven surface are used for fabricating the integrated semiconductor light-emitting device LDA. However, even if both the first and second laser parts LD1 and LD2 are of the ridge stripe type, the laser parts LD1 and LD2 can be successfully bonded with high precision positioning of the emission spots by means of fusion of the metal bonding layer CNT. This is not limited to the laser part, but even if the bonding surface of any portion is uneven, high precision positioning of the emission spots can be obtained by means of fusion of the metal boding layer CNT. Similarly, even if both the first and second laser parts LD1 and LD2 are of the buried type with a flat surface, the same effects can be obtained.

In the third embodiment, as illustrated in FIG. 4E, the bonding layer CNT is formed on the entire surface of the first laser wafer 100, but the bonding layer CNT need not be formed on a region corresponding to the stage CL. In this case, when the p-electrode pad P3 is formed as shown in FIG. 6D, the bonding layer CNT is not provided on the stage CL. However, the p-electrode pad P3 can be formed on an exposed portion of the p-electrode metal layer M1 extending to the stage CL, whereby a supply of drive current to the first and second laser parts LD1 and LD2 is possible.

Fourth Embodiment

Next, a method for manufacturing the integrated semiconductor light-emitting device LDB illustrated in FIG. 2, according to the second embodiment of the present invention, will be described in detail with reference to FIGS. 7A to 8D as a fourth embodiment. FIGS. 7A to 8D are sectional views illustrating in the order of the steps of the manufacturing method for the integrated semiconductor light-emission device LDB, and the same components or regions as or the corresponding components or regions to those in FIG. 2 are designated with the same reference numerals as in FIG. 2.

As in the case of the third embodiment, in the fourth embodiment, a first laser wafer 100 with an n-type semiconductor substrate SUB1 on which a plurality of first laser parts LD1 are formed, and a second laser wafer 200 with a support substrate (e.g. sapphire substrate) SUB2 on which a plurality of second laser parts LD2 are formed are prefabricated. The first and second laser wafers 100 and 200 are bonded together with a bonding layer CNT. Then, the support substrate SUB2 is removed by the use of the laser lift-off technique. After that, the bonded first and second laser wafers 100 and 200 are cleaved to form a plurality of integrated semiconductor light-emitting devices LDB.

The third embodiment has described the manufacturing method in which the stage CL is formed on the first laser wafer 100, whereas in the fourth embodiment, the integrated semiconductor light-emitting device LDB is fabricated without forming the stage CL.

Figure 7A:
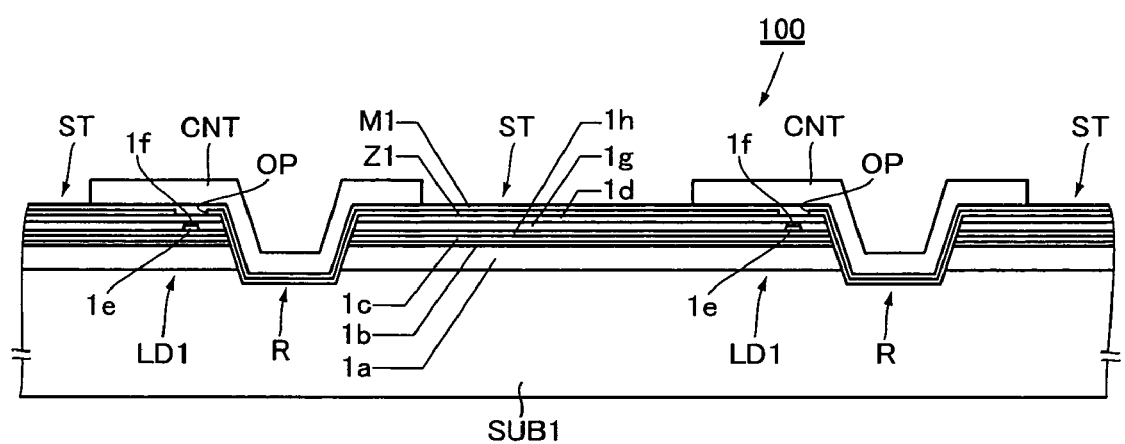
FIGS. 7A and 7B are sectional views illustrating a concrete method of manufacturing the integrated semiconductor light-emitting device shown in FIG. 2.

The first laser wafer 100 is made to have the structure as shown in FIG. 7A.

First, as in the case of FIG. 4A, by the use of MOCVD techniques and the photolithography, a multiple thin-film layer of an AlInGap-based semiconductor is formed on an n-GaAs semiconductor substrate SUB1. Then, as in the case of FIG. 4B, by the photolithography, predetermined regions of the thin-film layer are etched to reach the n-type GaAs semiconductor substrate SUB1 in order to form a plurality of trenches R for individually receiving a plurality of second laser parts LD2 fitted therein. A first laser part LD1 and a flat portion ST are formed in the same positions as those shown in FIG. 4B.

Then, as illustrated in FIG. 7A, an $SiO_2$ insulating film Z1 about 2000 Å thick is formed on the first laser parts LD1, the flat portions ST and the trenches R. The insulating film Z1 has an opening window OP faced to a set of a stripe-shaped p-type intermediate layer 1f and a stripe-shaped second p-type cladding layer 1e. Then, through a vacuum evaporation process, chromium (Cr) about 500 Å thick and gold (Au) about 2000 Å thick are deposited in order on the entire surface of the insulating film Z1 including the opening window OP, thereby forming a p-electrode metal layer M1 which is electrically connected to a p-type intermediate layer 1f.

Then, a predetermined region on the thin-film layer is masked. Then, through a vacuum evaporation process, a bonding layer CNT about 2 μm thick consisting of stannum (Sn) is deposited on each first laser part LD1, each trench R, and a portion of each flat portion ST having a predetermined width beginning at the side edge of the trench R, to form the first laser wafer 100.

Figure 7B:
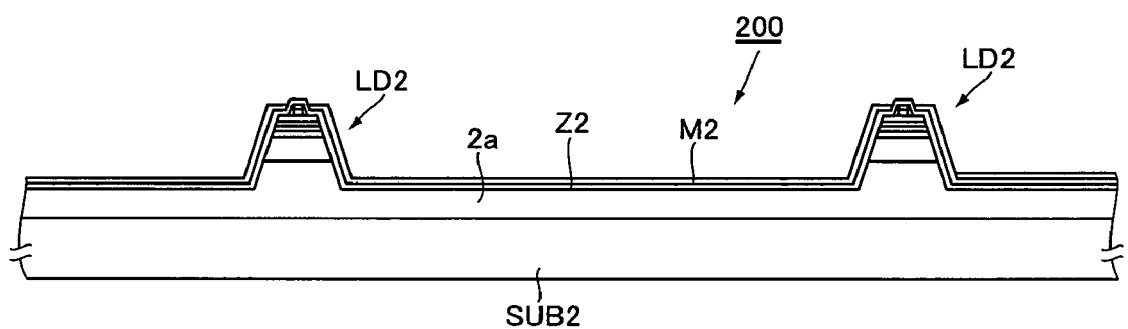

The second laser wafer 200 is made to have the structure as illustrated in FIG. 7B. That is, the second laser wafer 200 having the projection-shaped second laser parts LD2 including GaN-based semiconductor is made in the steps described in the third embodiment with reference to FIGS. 5A to 5E.

Figure 8A:
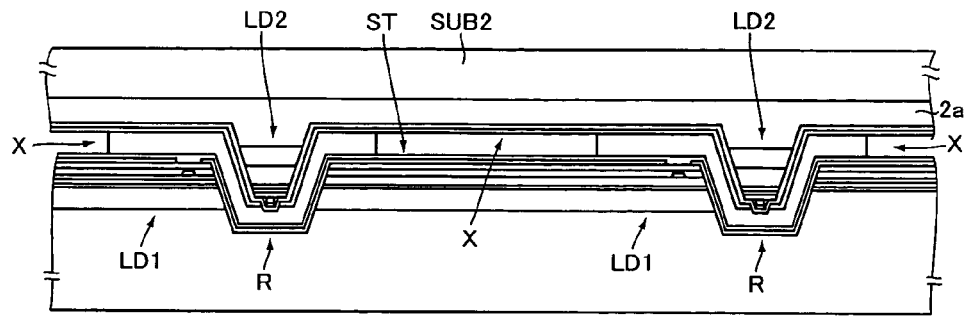
FIGS. 8A, 8B, 8C and 8D are sectional views further illustrating a concrete method of manufacturing the integrated semiconductor light-emitting device shown in FIG. 2.

Next, as illustrated in FIG. 8A, the second laser parts LD2 on the second laser wafer 200 are fitted into the corresponding trenches R formed in the first laser wafer 100 by the use of a jig. The first and second laser wafers 100 and 200 undergo heat treatment for about five minutes at about 310° C. in forming gas (a nitrogen-hydrogen mixture). As a result of the heat treatment, the Sn bonding layer CNT melts to attach together the first laser wafer 100 and the second laser wafer 200.

The second p-type cladding layer 1e, the p-type intermediate layer 1f and the trench R, each of which is formed with stripe shape on the first laser wafer 100, are formed in a direction completely perpendicular to the cleavage of the AlInGap-based semiconductor crystal. Similarly, the ridge stripe and the second laser part LD2 on the second laser wafer 200 are formed in a direction completely perpendicular to the cleavage of the AlInGan-based semiconductor crystal.

For this reason, when the second laser part LD2 on the second laser wafer 200 is fitted into and bonded to the trench R formed in the first laser wafer 100, the respective cleavages of the first laser wafer 100 and the second laser wafer 200 are completely aligned.

Further, the MQW active layer 1b formed in the first laser part LD1 of the first laser wafer 100 and the MQW active layer 2d formed in the second laser part LD2 of the second laser wafer 200 are aligned on approximately the same plane in the horizontal direction.

Figure 8B:
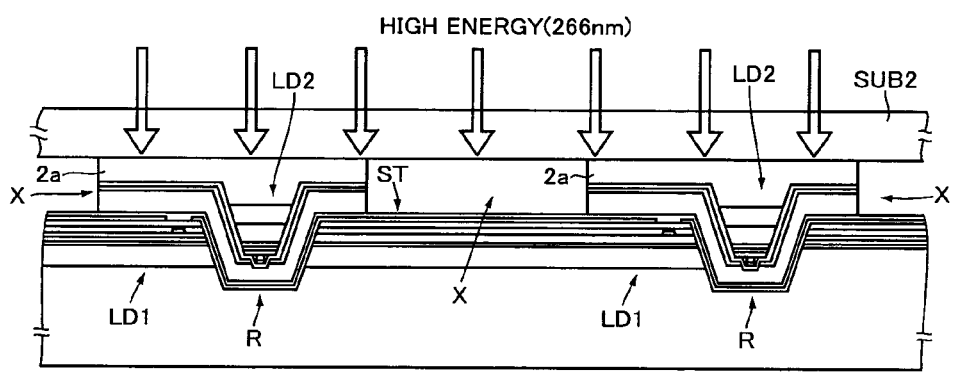

Next, as illustrated in FIG. 8B, a high energy light with the quadruple wavelength of YAG laser (i.e. wavelength of 266 nm band) is irradiated from the back (i.e. the top in FIG. 8B) of the support substrate SUB2. The high energy light with the 266 nm wavelength passes through the support substrate SUB2 which is the sapphire substrate, and is absorbed by the n-type base layer 2a located around the interface adjoining the support substrate SUB2, so that GaN of the sapphire substrate interface is decomposed. Thereupon, the portion of a stack of the n-type base layer 2a, p-electrode metal layer M2 and the insulating film Z2, which faces a space X having no bonding layer CNT formed, is destroyed and removed into the space X. The bonding force decreases around the interface between the remaining portion of the n-type base layer 2a and the support substrate SUB2.

Figure 8C:
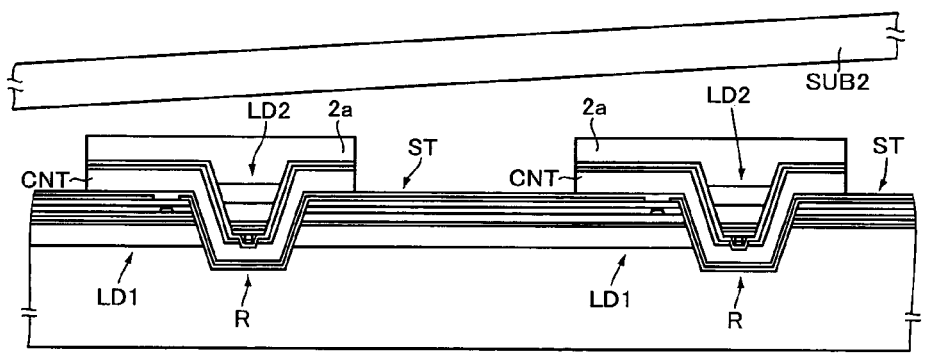

Next, as illustrated in FIG. 8C, the support substrate SUB2 weakened in the bonding force to the n-type base layer 2a is removed.

Figure 8D:
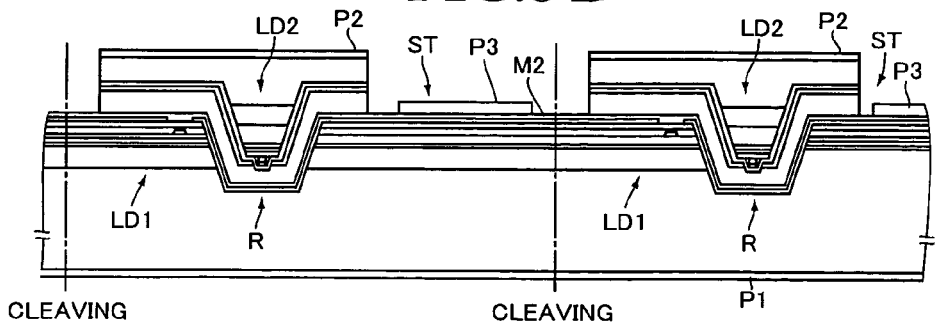

Then, as illustrated in FIG. 8D, the back (bottom in FIG. 6D) of the n-type semiconductor substrate SUB1 is polished until the thickness of the semiconductor substrate SUB1 becomes about 100 μm. After a damage layer created by the polishing is removed by the use of etchant such as sulfuric acid, an Au—Ge—Ni n-electrode P1 about 2000 Å thick is vapor-deposited on the back of the n-type semiconductor substrate SUB1. Further, the substantially exposed surface of the n-type base layer 2a on which the second laser part LD2 is provided is treated with hydrochloric acid or the like, and metal gallium and the like remaining on the treated surface are removed. Then, an n-type electrode P2 consisting essentially of Ti/Al or the like is vapor-deposited thereon. Further, a p-type electrode pad P3 consisting essentially of gold (Au) is vapor-deposited on a portion of the p-electrode metal layer M2 corresponding to each flat portion ST.

The integrated first and second laser parts LD1 and LD2 are cleaved in a direction perpendicular to the longitudinal direction of the ridge portion.

Thus, the cleavage of the first laser wafer 100 which is the AlInGap-based semiconductor crystal forming the first laser part LD1 and the cleavage of the second laser wafer 200 which is the AlInGan-based semiconductor crystal forming the second laser part LD2 are completely aligned with each other as described earlier. Hence, the end faces of the first and second laser parts LD1 and LD2 which are obtained after the cleaving process are completely aligned on the same plane.

After that, the n-type semiconductor substrate SUB1 is further cleaved along the flat portion ST into chips to complete individual integrated semiconductor light-emitting devices LDB having the structure as shown in FIG. 2.

In FIG. 8D, because the cleaving for cutting up the substrate into chips is performed between the p-electrode pad P3 and the laser part LD1, the resulting multiple wavelength laser device has the laser part LD2 located between the p-electrode pad P3 and the laser part LD1. Alternatively, if the cleaving is performed between the p-electrode pad P3 and the rise MES, it is possible to fabricate a multiple wavelength laser device having the laser part LD1 located between the p-electrode pad P3 and the laser part LD2. Such a possibility allows a selection of a multiple wavelength laser device with an arrangement suited to a type of a pickup on which it is mounted.

In the manufacturing method in the fourth embodiment, the first laser wafer 100 having a plurality of first laser parts LD1 and the second laser wafer 200 having a plurality of second laser parts LD2 are bonded and combined together by the bonding layer CNT. Then, the high energy light with the quadruple wavelength of YAG laser (i.e. 266 nm in wavelength) is irradiated from the back of the support substrate SUB2 of the second laser wafer 200, whereby the support substrate SUB2 is removed. Then, the combined wafer is cut up through the cleaving process into a plurality of integrated semiconductor light-emitting devices LDB. Because of these processes, an improvement of mass productivity is obtained.

Further, in the bonding process for the first laser wafer 100 and the second laser wafer 200, each of the projection-shaped second laser parts LD2 is fitted into the recess-shaped trench R formed between the first laser part LD1 and the flat portion ST. Then the first and second laser wafers 100 and 200 are bonded together by fusion of the bonding layer CNT. This manner provides high precision positioning of emission spots A and B in the first and second laser parts LD1 and LD2, leading to a fabrication of the integrated semiconductor light-emitting device LDB with uniform distance between the emission spots.

Although the bonding surfaces of the first and second laser parts LD1 and LD2 are not flat, but uneven because of the ridge stripe shape provided thereon or the like, the metal bonding layer CNT used for bonding is deformable, and therefore the laser parts LD1 and LD2 can be bonded together in a high degree of tight contact.

This tight contact also makes it possible to provide the high precision positioning of the respective emission spots A and B of the first and second laser parts LD1 and LD2, leading to a fabrication of the integrated semiconductor light-emitting device LDB with uniform distance between the emission spots.

Further, in the manufacturing method in the forth embodiment, the first laser part LD1 of the buried type with a flat surface, and the second laser part LD2 of the ridge stripe type with an uneven surface are used for fabricating the integrated semiconductor light-emitting device LDB. However, even if both the first and second laser parts LD1 and LD2 are of the ridge stripe type, the laser parts LD1 and LD2 can be successfully bonded with high precision positioning of the emission spots by means of fusion of the metal bonding layer CNT. This is not limited to the laser part, but even if the bonding surface of any portion is uneven, bonding with high precision positioning of the emission spots is possible by means of fusion of the metal boding layer CNT. Similarly, even if both the first and second laser parts LD1 and LD2 are of the buried type with a flat surface, the same effects can be obtained.

The integrated semiconductor light-emitting devices LDA and LDB described in the first and second embodiments and the integrated semiconductor light-emitting devices LDA and LDB manufactured by the methods described in the third and fourth embodiments are a two-wavelength laser device which emits two laser lights having different wavelengths. It is possible to manufacture an integrated semiconductor light-emitting device emitting three or more laser lights by means of an appropriate combination of the manufacturing methods of the third and fourth embodiments.

Figure 9:
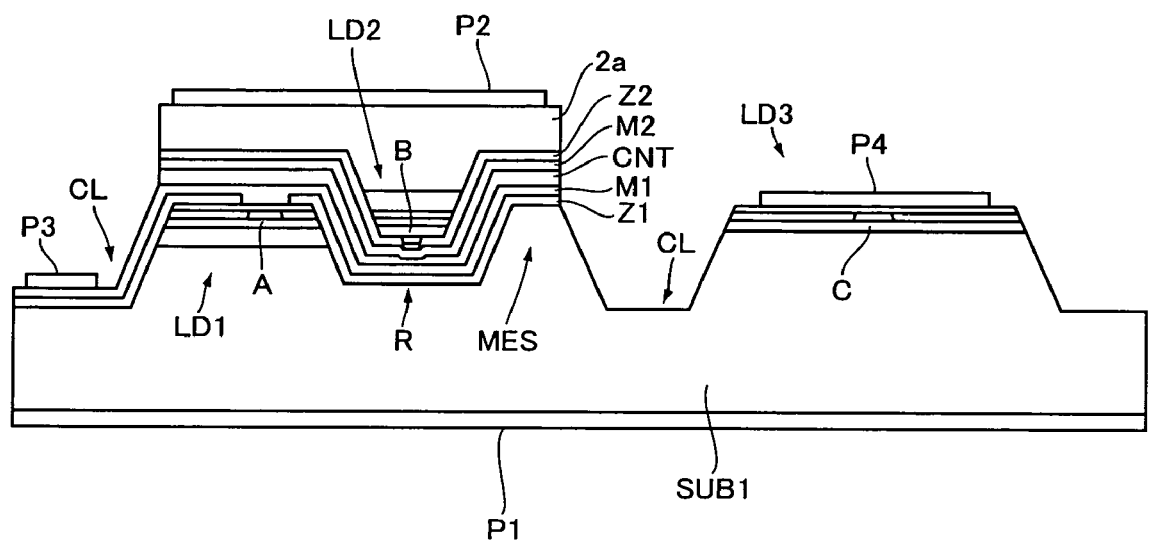
FIG. 9 is a schematically sectional view of the structure of a modification of the integrated semiconductor light-emitting device.
Figure 10A:
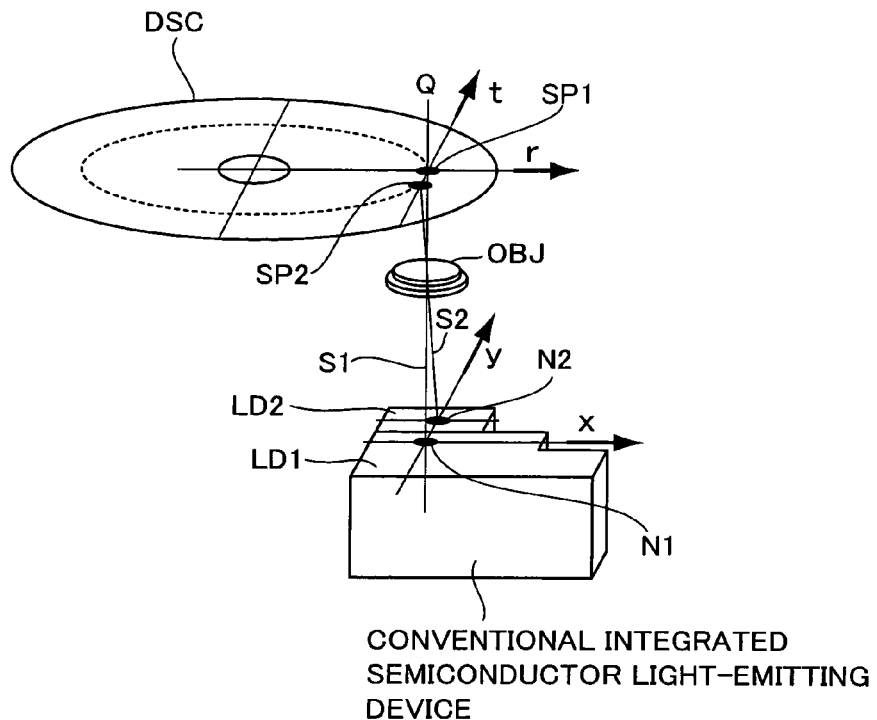
FIGS. 10A and 10B are diagrams for explaining problems associated with conventional integrated semiconductor light-emitting devices.
Figure 10B:
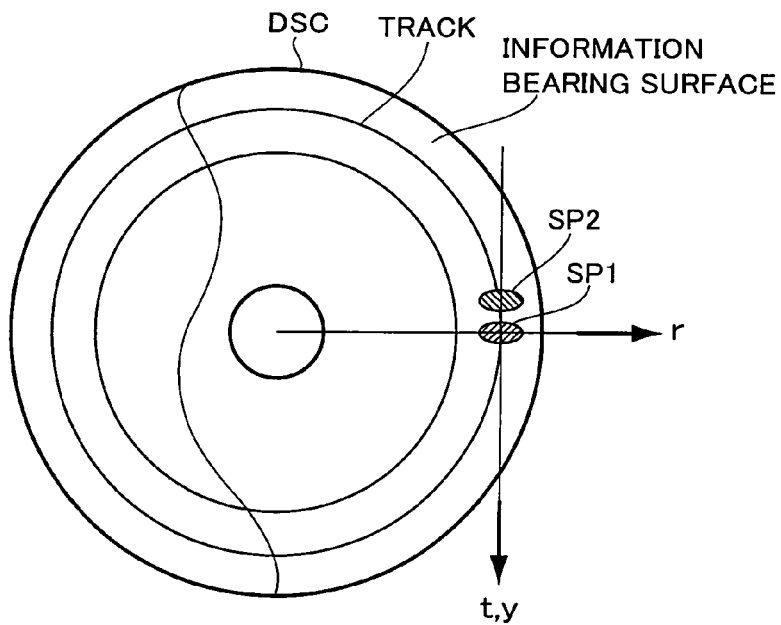

For example, as a modification example of the integrated semiconductor light-emitting devices LDA, LDB shown in FIGS. 1 and 2, a three-wavelength laser device having the structure as illustrated in the sectional view of FIG. 9 can be manufactured.

The structure of the three-wavelength integrated semiconductor light-emitting device firstly has a two-wavelength integrated laser which has an n-GaAs-based n-type semiconductor substrate SUB1 on which a first laser part LD1 emitting a red laser light and a third laser part LD3 emitting an infrared laser light are formed. The two-wavelength integrated laser has a trench R formed adjacent to the first laser part LD1 as in the case of the integrated semiconductor light-emitting device LDA shown in FIG. 1. Further, a projection-shaped second laser part LD2 is fitted into the trench R, and a metal bonding layer CNT bonds together the first laser part LD1, the second laser part LD2 and the like.

An outline will be given hereinafter of a method of manufacturing the three-wavelength integrated semiconductor light-emitting device. First, a multiple AlInGap-based semiconductor thin-film layer is formed on the n-GaAs-based n-type semiconductor substrate SUB1 in order to form the first laser parts LD1, the trenches R and the rises MES by the use of the MOCVD technique. Then, the photolithography and MOCVD Regrowth are performed to form a buried stripe structure.

Then, the photolithography is performed to remove the multiple AlInGap-based semiconductor thin-film layer exclusive of the portions corresponding to the region in which the first laser parts LD1, the trenches R and the rises MES will be formed, in order to expose the n-GaAs-based n-type semiconductor substrate SUB1.

After that, the MOCVD technique is again used to form another multi thin-film AlGaAs-based semiconductor layer for forming third laser parts. Then, the photolithography and MOCVD Regrowth are performed to form a buried stripe structure.

Then, the photolithography is performed to remove the multiple AlGaAs-based semiconductor thin-film layer exclusive of the portions corresponding to the third laser parts LD3. Thereby, two-wavelength integrated lasers, each of which has the first laser part LD1 emitting a red laser light and a third laser part LD3 emitting an infrared laser light formed on the n-GaAs-based n-type semiconductor substrate SUB1, are made.

Further, the predetermined regions of the thin-film layer for forming the first laser parts LD1 are etched to form the trenches R, thereby forming the projection-type first laser part LD1 and the rise MES on both sides of each trench R. After that, an electric insulating film Z1 and a p-electrode metal layer M1 are stacked on the predetermined region of the stage CL, the first laser part LD1, the trench R and the rise MES. Then, a metal bonding layer CNT is formed only on the predetermined region of the p-electrode metal layer M1 facing the first laser part LD1, the trench R and the rise MES.

In this manner, the first laser wafer is made initially. Then, into the trenches R in the first laser wafer, the projection-shaped second laser parts LD2 including GaN-based semiconductor on the second laser wafer 200 shown in FIG. 5E or 7B are fitted, and then the above first laser wafer and the second laser wafer 200 are combinedly bonded together by fusion of the bonding layer CNT.

Next, a high energy light with the quadruple wavelength of YAG laser (i.e. 266 nm in wavelength) is irradiated from the back (i.e. the top in FIG. 9) of the support substrate SUB2 in the second laser wafer 200. After the support substrate SUB2 is removed from the base layers 2a for the second laser parts LD2, n-electrodes P1 and P2 and a p-electrode P4 are stacked individually on the bottom of the n-type semiconductor substrate SUB1, the top of the base layer 2a and the top of the third laser part LD3, as shown in FIG. 9. Further, a p-electrode pad P3 is formed on a portion of the p-electrode metal layer M1 exposed on the stage CL. Then, the combined first and second laser wafers are cleaved in sets of the first, second and third laser parts LD1, LD2 and LD3 to form individual three-wavelength laser devices.

In the three-wavelength laser device with such a structure, when forward current is supplied between the p-electrode pad P3 and then-electrode P1, a red laser light is emitted from an emission spot A of the first laser part LD1. When forward current is supplied between the p-electrode pad P3 and the n-electrode P2, a blue laser light is emitted from an emission spot B of the second laser part LD2. When forward current is supplied between the p-electrode P4 and the n-electrode P1, an infrared laser light is emitted from an emission spot C of the third laser part LD3.

Further, because the emission spots A, B and C are located away in approximately the same horizontal direction. Thus, when the three-wavelength integrated semiconductor light-emitting device is mounted on a pickup provided in an information recording/reproducing system such as a DVD player having compatibility, the superior effects such as the effective use of a tilt correction mechanism can be accomplished.

The terms and description used herein are set forth by way of illustration only and are not meant as limitations. Those skilled in the art will recognize that numerous variations are possible within the spirit and scope of the invention as defined in the following claims.

What is claimed is:

1. An integrated semiconductor light-emitting device emitting a plurality of laser lights differing in wavelength, comprising:
    a first laser part stacked on a semiconductor substrate;
    a second laser part with a projection shape formed by stack in thin-film-layer form;
    a trench for receiving the second laser part therein, the trench being formed adjacent to the first laser part on the semiconductor substrate;
    an electric insulation film formed at least on the first laser part and an inside surface of the trench;
    an electrode metal layer stacked on the electric insulation film to cover the film; and
    a bonding layer for bonding together at least the first laser part, the second laser part and the trench.

2. The integrated semiconductor light-emitting device according to claim 1, wherein respective emission spots of the first laser part and the second laser part are located away in approximately a same horizontal direction perpendicular to a direction of stack of the first and second laser parts.

3. The integrated semiconductor light-emitting device according to claim 1, wherein, in a direction perpendicular to a direction of stack of the first and second laser parts, an occupation area of the semiconductor substrate is greater than a bonded area of at least the first laser part, the second laser part and the trench, and the bonding layer extends onto the semiconductor substrate based on a difference in area between the bonded area and the occupation area.

4. The integrated semiconductor light-emitting device according to claim 1, wherein the bonding layer for bonding the first laser part and the second laser part has a same area as that of the second laser part in a plane perpendicular to a direction of a stack of the first and second laser parts, and essentially consists of a substance with electric conductivity.

5. The integrated semiconductor light-emitting device according to claim 1, further comprising:
    a stage portion formed on an area other than an area where the second laser part is bonded on the first laser part, extending from a semiconductor multilayer film toward the semiconductor substrate, and the stage being covered with the electric insulation film,
    wherein the electrode metal layer continuously extends from the trench through the stage and covers the insulation film.

6. The integrated semiconductor light-emitting device according to claim 1, wherein:
    the first laser part has either a group II-VI compound semiconductor or a group III-V compound semiconductor including any one of arsenic (As), phosphorus (P) and antimony (Sb) as a group V element; and
    the second laser part has a nitride-based group III-V compound semiconductor including nitrogen (N) as a group V element.

7. The integrated semiconductor light-emitting device according to claim 1, wherein the second laser part has a ridge waveguide.

* * * * *